United States Patent
Yamamoto et al.

(10) Patent No.: US 11,336,259 B2
(45) Date of Patent: May 17, 2022

(54) ACOUSTIC WAVE DEVICE, FILTER, AND MULTIPLEXER

(71) Applicant: TAIYO YUDEN CO., LTD., Tokyo (JP)

(72) Inventors: Shinji Yamamoto, Tokyo (JP); Ryohei Komiyama, Tokyo (JP); Koichi Satoh, Tokyo (JP); Hitoshi Tsukidate, Tokyo (JP); Michio Miura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 171 days.

(21) Appl. No.: 16/802,071

(22) Filed: Feb. 26, 2020

(65) Prior Publication Data

US 2020/0313650 A1   Oct. 1, 2020

(30) Foreign Application Priority Data

Mar. 25, 2019   (JP) .............. JP2019-057274

(51) Int. Cl.
| | |
|---|---|
| *H03H 9/02* | (2006.01) |
| *H03H 9/25* | (2006.01) |
| *H03H 9/64* | (2006.01) |
| *H03H 9/145* | (2006.01) |
| *H03H 9/72* | (2006.01) |
| *H03H 3/08* | (2006.01) |
| *H03H 9/05* | (2006.01) |

(52) U.S. Cl.
CPC ............... *H03H 9/25* (2013.01); *H03H 3/08* (2013.01); *H03H 9/02559* (2013.01); *H03H 9/02637* (2013.01); *H03H 9/0585* (2013.01); *H03H 9/14544* (2013.01); *H03H 9/6483* (2013.01); *H03H 9/725* (2013.01)

(58) Field of Classification Search
CPC .............. H03H 9/25; H03H 9/64; H03H 9/72; H03H 9/145
See application file for complete search history.

(56) References Cited

U.S. PATENT DOCUMENTS

| | | | | |
|---|---|---|---|---|
| 4,388,600 A | * | 6/1983 | Wakino | H03H 9/02866 310/313 R |
| 7,067,956 B2 | * | 6/2006 | Imai | H03H 9/6483 310/313 D |

(Continued)

FOREIGN PATENT DOCUMENTS

| | | |
|---|---|---|
| JP | 52-153647 A | 12/1977 |
| JP | 2015-115870 A | 6/2015 |
| JP | 2018-061258 A | 4/2018 |

*Primary Examiner* — Dean O Takaoka
(74) *Attorney, Agent, or Firm* — Stein IP, LLC

(57) ABSTRACT

An acoustic wave device includes: a piezoelectric substrate: a pair of comb-shaped electrodes located on the piezoelectric substrate, each of the comb-shaped electrodes including a plurality of electrode fingers; a support substrate having protruding portions and/or recessed portions in a region overlapping with the pair of comb-shaped electrodes in plan view, the protruding portions and/or recessed portions being regularly arranged; and an insulating layer directly or indirectly bonded between the piezoelectric substrate and the support substrate, a boundary face between the insulating layer and the support substrate being provided along the protruding portions and/or the recessed portions.

15 Claims, 18 Drawing Sheets

(56) References Cited

U.S. PATENT DOCUMENTS

| | | | | |
|---|---|---|---|---|
| 7,453,184 B2* | 11/2008 | Kando | ................. | H03H 9/0222 |
| | | | | 310/313 B |
| 7,609,129 B2* | 10/2009 | Yokota | ............... | H03H 9/02574 |
| | | | | 333/133 |
| 9,484,886 B2* | 11/2016 | Takemura | ............ | H03H 9/1092 |
| 10,020,796 B2* | 7/2018 | Gilbert | .............. | H03H 9/02574 |
| 10,469,056 B2* | 11/2019 | Ruby | ................. | H03H 9/02574 |
| 2017/0063331 A1* | 3/2017 | Gilbert | ............... | H03H 9/02574 |
| 2019/0288661 A1* | 9/2019 | Akiyama | ........... | H03H 9/02818 |

* cited by examiner

FIG. 8A
FIG. 8B
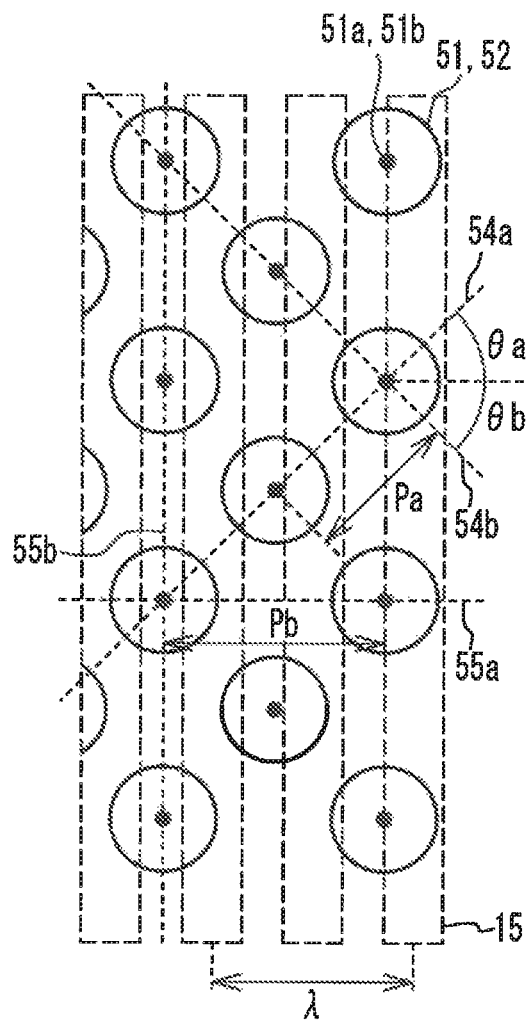
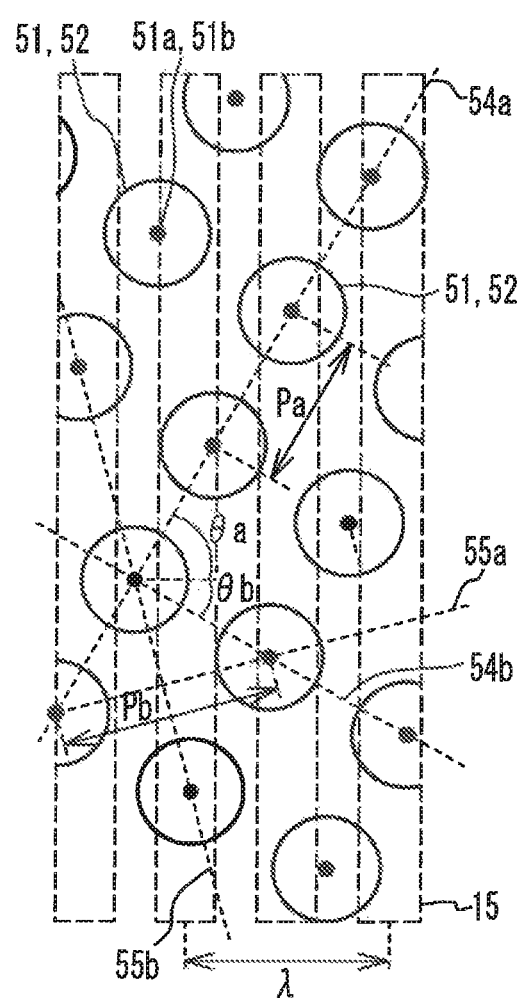

ACOUSTIC WAVE DEVICE, FILTER, AND MULTIPLEXER

CROSS-REFERENCE TO RELATED APPLICATION

This application is based upon and claims the benefit of priority of the prior Japanese Patent Application No. 2019-057274, filed on Mar. 25, 2019, the entire contents of which are incorporated herein by reference.

FIELD

A certain aspect of the present invention relates to an acoustic wave device, a filter, and a multiplexer.

BACKGROUND

There have been known surface acoustic wave resonators as acoustic wave resonators used in communication devices such as smartphones. It has been known to bond a piezoelectric substrate on which a surface acoustic wave resonator is to be formed to a support substrate. It has been known to roughen the upper surface of the support substrate as disclosed in, for example, Japanese Patent Application Publication No. 2018-61258 (hereinafter, referred to as Patent Document 1).

SUMMARY OF THE INVENTION

According to a first aspect of the embodiments, there is provided an acoustic wave device including: a piezoelectric substrate: a pair of comb-shaped electrodes located on the piezoelectric substrate, each of the comb-shaped electrodes including a plurality of electrode fingers; a support substrate having protruding portions and/or recessed portions in a region overlapping with the pair of comb-shaped electrodes in plan view, the protruding portions and/or recessed portions being regularly arranged; and an insulating layer directly or indirectly bonded between the piezoelectric substrate and the support substrate, a boundary face between the insulating layer and the support substrate being provided along the protruding portions and/or the recessed portions.

According to a second aspect of the embodiments, there is provided a filter including the above acoustic wave device.

According to a third aspect of the embodiments, there is provided a multiplexer including the above filter.

BRIEF DESCRIPTION OF THE DRAWINGS

FIG. 8A and FIG. 8B are plan views respectively illustrating fifth and sixth examples of the arrangement of the protruding portions and the recessed portions in the first embodiment;

DETAILED DESCRIPTION

Spurious emissions can be reduced by roughening the upper surface of the support substrate. In Patent Document 1, the upper surface of the support substrate is roughened by grinding or wet-etching the entire upper surface of the support substrate. Use of grinding or wet-etching makes the rough surface irregularly (i.e., randomly) uneven. This results in large variation in characteristics. For example, the magnitude of the spurious emission differs depending on the location.

Hereinafter, a description will be given of embodiments with reference to the accompanying drawings.

First Embodiment

Figure 1A:
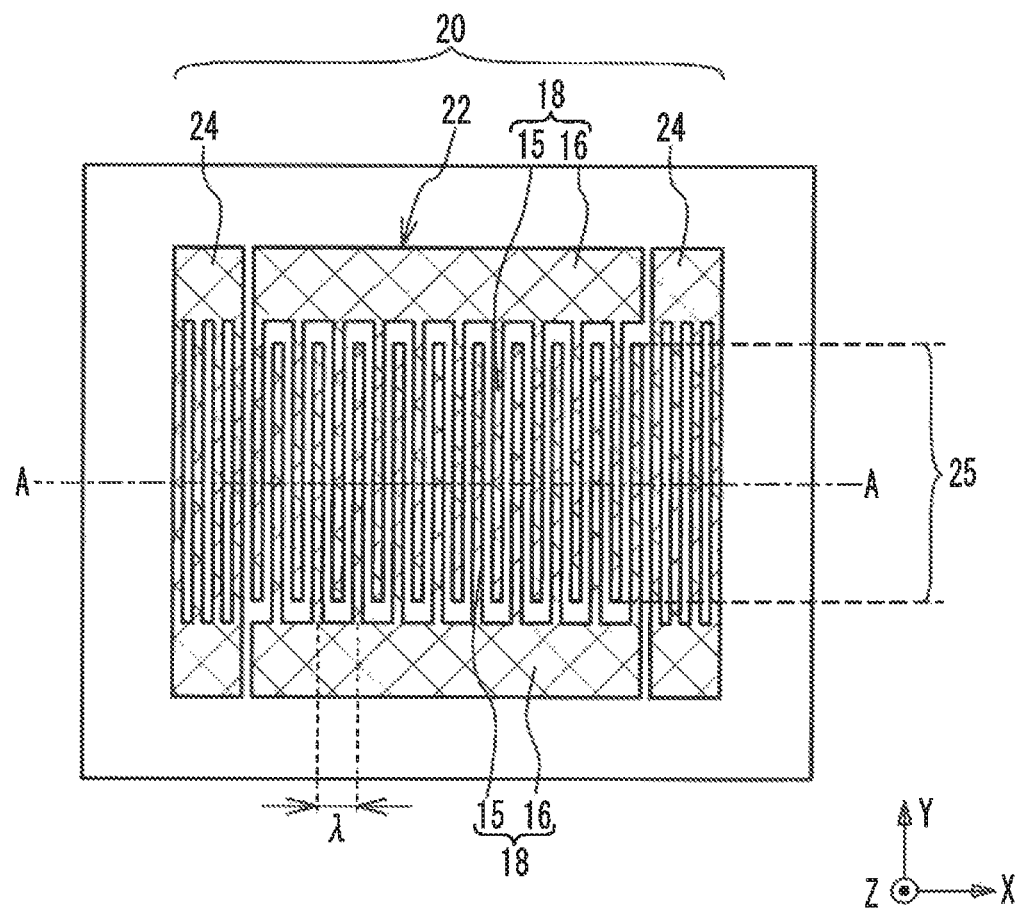
FIG. 1A is a plan view of an acoustic wave resonator in a first embodiment.
Figure 1B:
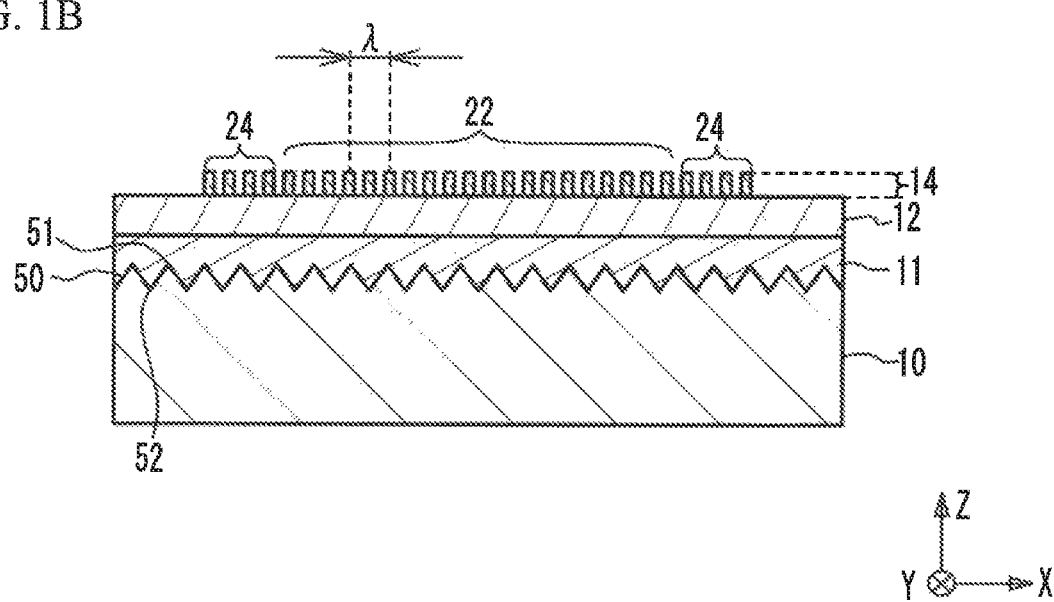
FIG. 1B is a cross-sectional view taken along line A-A in FIG. 1A.

FIG. 1A is a plan view of an acoustic wave resonator in accordance with a first embodiment, and FIG. 1B is a cross-sectional view taken along line A-A in FIG. 1A. A direction in which electrode fingers are arranged (the arrangement direction) is defined as an X direction, a direction in which the electrode finger extends (the extension direction) is defined as a direction, and a direction in which a support substrate and a piezoelectric substrate are stacked (the stacking direction) is defined as a Z direction.

The X direction, the Y direction, and the Z direction do not necessarily correspond to the X-axis orientation and the Y-axis orientation of the crystal orientation of the piezoelectric substrate. When the piezoelectric substrate is a rotated Y-cut X-propagation substrate, the X direction is the X-axis orientation of the crystal orientation.

As illustrated in FIG. 1A and FIG. 1B, an insulating layer 11 is located on a support substrate 10. A boundary face 50 between the support substrate 10 and the insulating layer 11 is a rough face, and has a plurality of protruding portions 51 and a plurality of recessed portions 52. A piezoelectric substrate 12 is located on the insulating layer 11. An acoustic wave resonator 20 is located on the piezoelectric substrate 12. The acoustic wave resonator 20 includes an inter digital transducer (IDT) 22 and reflectors 24. The reflectors 24 are located at both sides of the IDT 22 in the X direction. The IDT 22 and the reflectors 24 are formed of a metal film 14 on the piezoelectric substrate 12.

The IDT 22 includes a pair of comb-shaped electrodes 18 facing each other. The comb-shaped electrode 18 includes a plurality of electrode fingers 15 and a bus bar 16 to which the electrode fingers 15 are connected. The region where the electrode fingers 15 of one of the comb-shaped electrodes 18 overlap with the electrode fingers 15 of the other of the comb-shaped electrodes 18 is an overlap region 25. The length of the overlap region 25 is an aperture length. The comb-shaped electrodes 18 are located so as to face each other such that the electrode fingers 15 of one of the comb-shaped electrodes 18 and the electrode fingers 15 of the other of the comb-shaped electrodes 18 are substantially alternately arranged in at least a part of the overlap region 25. The acoustic wave excited by the electrode fingers 15 propagates mainly in the X direction in the overlap region 25. The pitch of the electrode fingers 15 of one of the comb-shaped electrodes 18 corresponds to the wavelength $\lambda$ of the acoustic wave. The wavelength $\lambda$ of the acoustic wave is substantially equal to two times the pitch of the electrode fingers 15. The reflectors 24 reflect the acoustic wave (the surface acoustic wave) excited by the electrode fingers 15 of the IDT 22. Accordingly, the acoustic wave is confined in the overlap region 25 of the IDT 22.

The piezoelectric substrate 12 is a monocrystalline lithium tantalate ($LiTaO_3$) substrate, a monocrystalline lithium niobate ($LiNbO_3$) substrate, or a monocrystalline crystal substrate, and is, for example, a rotated Y-cut X-propagation lithium tantalate substrate or a rotated Y-cut X-propagation lithium niobate substrate. The insulating layer 11 is an amorphous and/or polycrystalline layer mainly composed of, for example, silicon oxide ($SiO_2$). The insulating layer 11 may be mainly composed of silicon oxide, and contain impurities such as fluorine. The temperature coefficient of the elastic constant of the insulating layer 11 is opposite in sign to the temperature coefficient of the elastic constant of the piezoelectric substrate 12. Thus, the temperature coefficient of frequency of the acoustic wave resonator can be reduced.

The support substrate 10 has a linear expansion coefficient smaller than the linear expansion coefficient in the X direction of the piezoelectric substrate 12. Thus, the temperature coefficient of frequency of the acoustic wave resonator can be reduced. The support substrate 10 is, for example, a sapphire substrate, an alumina substrate, a silicon substrate, or a silicon carbide substrate. The sapphire substrate is a monocrystalline aluminum oxide ($Al_2O_3$) substrate of which the upper surface is the r-face, the c-face, or the a-face. The alumina substrate is a polycrystalline aluminum oxide ($Al_2O_3$) substrate. The silicon substrate is a monocrystalline or polycrystalline silicon (Si) substrate. The silicon carbide substrate is a monocrystalline or polycrystalline silicon carbide (SiC) substrate.

The metal film 14 is a film mainly composed of, for example, aluminum (Al), copper (Cu), or molybdenum (Mo), and is, for example, an aluminum film, a copper film, or a molybdenum film. An adhesion film such as a titanium (Ti) film or a chrome (Cr) film may be provided between the electrode finger 15 and the piezoelectric substrate 12. The adhesion film is thinner than the electrode finger 15. An insulating film may be provided so as to cover the electrode fingers 15. The insulating film functions as a protective film or a temperature compensation layer.

The support substrate 10 has a thickness of, for example, 50 µm to 500 µm. The thickness of the insulating layer 11 is, for example, 0.1 µm to 10 µm, and is equal to or less than, for example, the wavelength $\lambda$ of the acoustic wave. The thickness of the piezoelectric substrate 12 is, for example, 0.1 µm to 20 µm, and is equal to or less than, for example, the wavelength $\lambda$ of the acoustic wave. The wavelength $\lambda$ of the acoustic wave is, for example, 1 µm to 6 µm. When two electrode fingers 15 is defined as one pair, the number of pairs of the electrode fingers 15 is, for example, 20 pairs to 300 pairs. The duty ratio of the IDT 22 is calculated by dividing the width of the electrode finger 15 by the pitch of the electrode fingers 15, and is, for example, 30% to 80%. The aperture length of the IDT 22 is, for example, 10$\lambda$ to 50$\lambda$.

Manufacturing Method of the First Embodiment

Figure 2A:
FIG. 2A through FIG. 2D are cross-sectional views (No. 1) illustrating a method of manufacturing the acoustic wave device in accordance with the first embodiment.
Figure 2B:
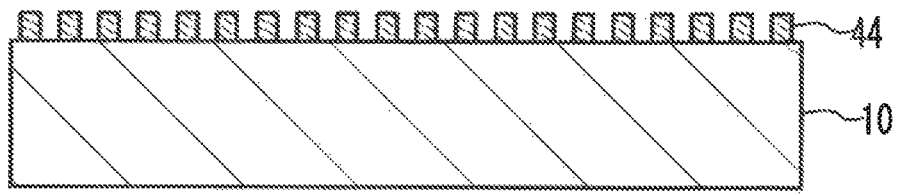

FIG. 2A to FIG. 3C are cross-sectional views illustrating a method of manufacturing the acoustic wave device in accordance with the first embodiment. As illustrated in FIG. 2A, the support substrate 10 having a flat surface is prepared. The arithmetic mean roughness Ra of the surface of the support substrate 10 is, for example, 1 nm or less. As illustrated in FIG. 2B, a mask layer 44 having apertures is formed on the support substrate 10. The mask layer 44 is formed of, for example, photoresist.

Figure 2C:
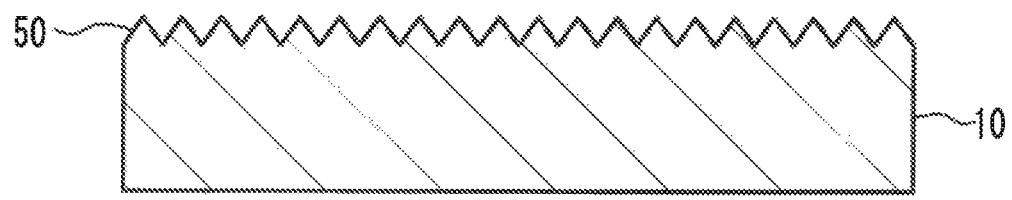

As illustrated in FIG. 2C, the upper part of the support substrate 10 is removed using the mask layer 44 as a mask. The upper part of the support substrate 10 is removed by, for example, etching or sandblasting. For example, when the support substrate 10 is a sapphire substrate, the support substrate 10 is removed by dry etching using chlorine-based gas. The etching liquid and the etching gas are appropriately selected according to the material of the support substrate 10.

Figure 2D:
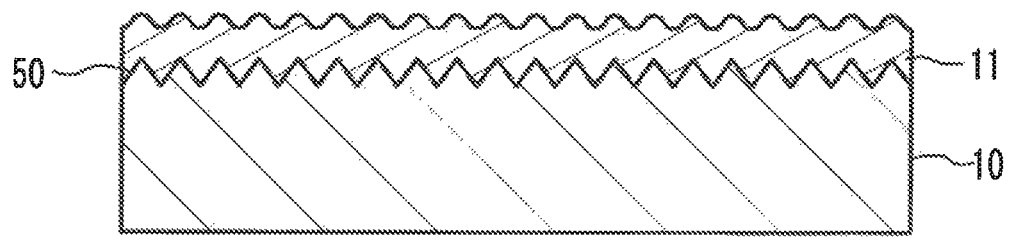

As illustrated in FIG. 2D, the insulating layer 11 is formed on the support substrate 10 by, for example, chemical vapor deposition (CVD), sputtering, or vacuum evaporation. This process forms the uneven boundary face 50 between the support substrate 10 and the insulating layer 11.

Figure 3A:
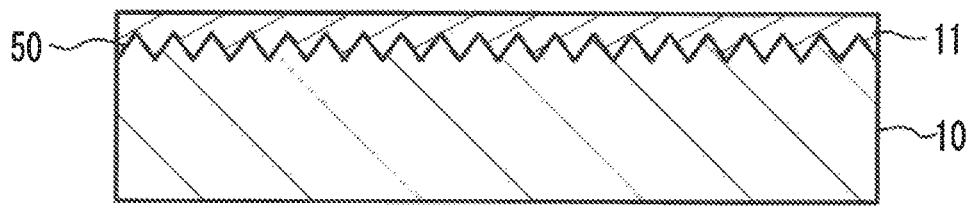
FIG. 3A through FIC. 3C are cross-sectional views (No. 2) illustrating the method of manufacturing the acoustic wave device in accordance with the first embodiment.
Figure 3B:
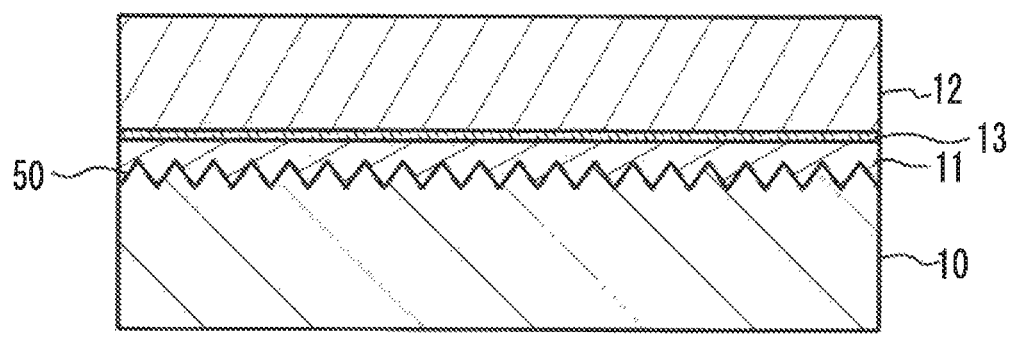
Figure 3C:
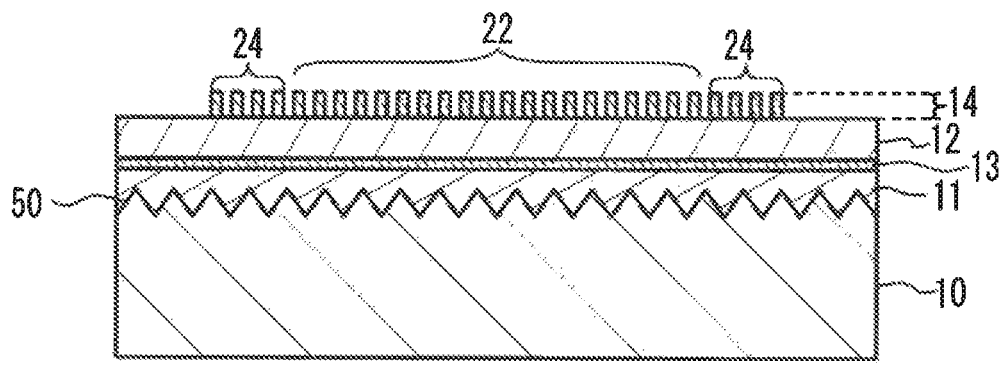

As illustrated in FIG. 3A, the upper surface of the insulating layer 11 is planarized by, for example, chemical mechanical polishing (CMP). As illustrated in FIG. 3B, the piezoelectric substrate 12 is bonded to the upper surface of the insulating layer 11 through a bonding layer 13. The bonding layer 13 is, for example, an aluminum oxide layer, an aluminum nitride layer, a diamond-like carbon layer, a silicon carbide layer, a silicon nitride layer, or a silicon layer. The bonding layer 13 has a thickness of, for example, 1 nm to 100 nm. The insulating layer 11 and the piezoelectric substrate 12 may be bonded not through the bonding layer 13. The insulating layer 11 and the piezoelectric substrate 12 are bonded by, for example, surface activation.

As illustrated in FIG. 3O, the upper surface of the piezoelectric substrate 12 is planarized by, for example, CMP.

Through this process, a composite substrate including the support substrate 10, the insulating layer 11, and the piezoelectric substrate 12 is formed. The acoustic wave resonator formed of the metal film 14 is formed on the upper surface of the piezoelectric substrate 12. Through the above steps, the acoustic wave device of the first embodiment is manufactured.

First Examples of Three-Dimensional Shapes of Protruding Portions and Recessed Portions FIG. 4A to FIG. 4M illustrate first examples of the three-dimensional shapes of the protruding portions and the recessed portions in the first embodiment. FIG. 4A to FIG. 4K are perspective views, and when the protruding portion 51 is illustrated, the upper direction is the positive Z direction as indicated by an arrow 56a. When the recessed portion 52 is illustrated, the upper direction is the negative Z direction as indicated by an arrow 56b. FIG. 4L is a plan view and FIG. 4M is a cross-sectional view. In FIG. 4A to FIG. 4M, the protruding portion 51 and the recessed portion 52 are island-shaped or dot-shaped.

Figure 4A:
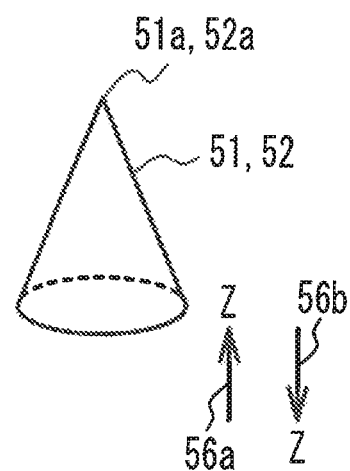
FIG. 4A through FIG. 4M illustrate first examples of the three-dimensional shapes of a protruding portion and a recessed portion in the first embodiment.
Figure 4B:
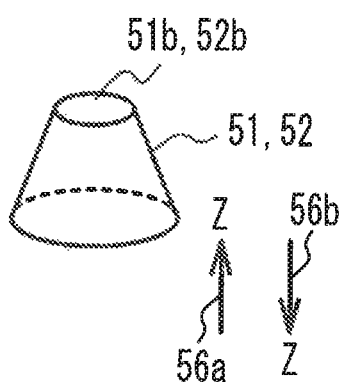
Figure 4C:
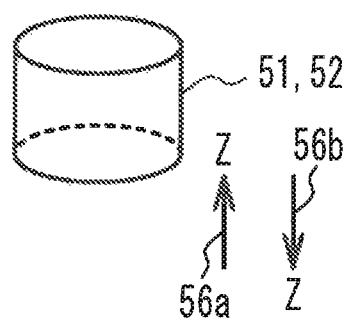

As illustrated in FIG. 4A, the protruding portion 51 has a cone shape having a top 51a and the recessed portion 52 has a cone shape having a top 52a. As illustrated in FIG. 4B, the protruding portion 51 has a circular truncated cone shape having an upper surface 51b, and the recessed portion 52 has a circular truncated cone shape having a lower surface 52b. As illustrated in FIG. 4C, the protruding portion 51 and the recessed portion 52 have a circular cylindrical shape.

Figure 4D:
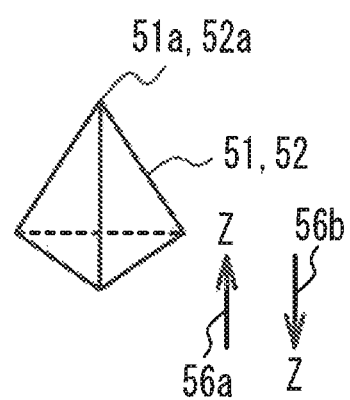
Figure 4E:
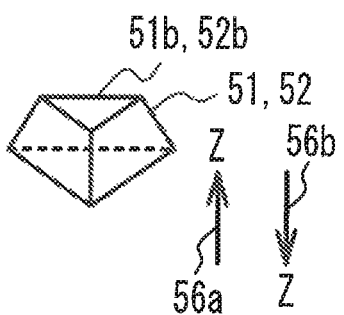
Figure 4F:
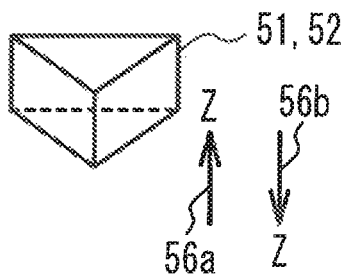

As illustrated in FIG. 4D, the protruding portion 51 has a trigonal pyramid shape having the top 51a, and the recessed portion 52 has a trigonal pyramid shape having the top 52a. As illustrated in FIG. 4E, the protruding portion 51 has a truncated trigonal pyramid shape having the upper surface 51b, and the recessed portion 52 has a truncated trigonal pyramid shape having the lower surface 52b. As illustrated in FIG. 4F, the protruding portion 51 and the recessed portion 52 have a triangle pole shape.

Figure 4G:
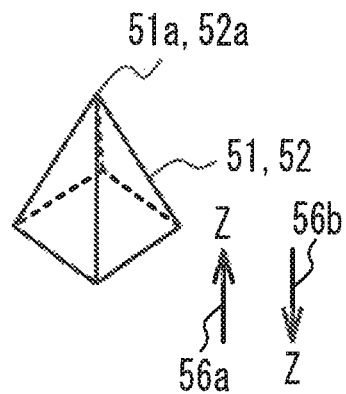
Figure 4H:
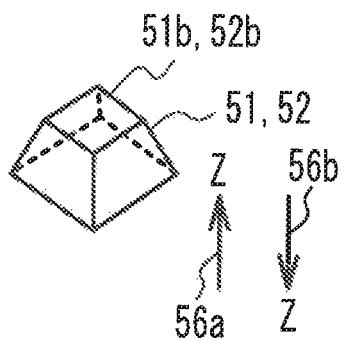
Figure 4I:
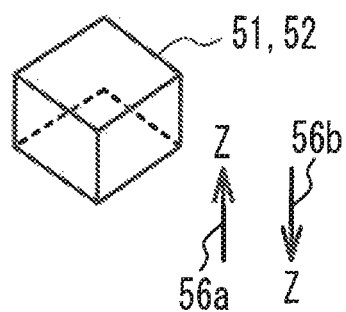

As illustrated in FIG. 4G, the protruding portion 51 has a quadrangular pyramid shape having the top 51a, and the recessed portion 52 has a quadrangular pyramid shape having the top 52a. As illustrated in FIG. 4H, the protruding portion 51 has a truncated quadrangular pyramid shape having the upper surface 51b, and the recessed portion 52 has a truncated quadrangular pyramid shape having the lower surface 52b. As illustrated in FIG. 4I, the protruding portion 51 and the recessed portion 52 have a quadrangular prism shape. As described above, the three-dimensional shapes of the protruding portions 51 and the recessed portions 52 may be a cone shape, a polygonal pyramid shape, a truncated cone shape, a truncated polygonal pyramid shape, a cylindrical shape, or a prism shape.

Figure 4J:
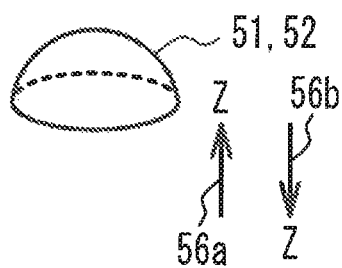
Figure 4K:
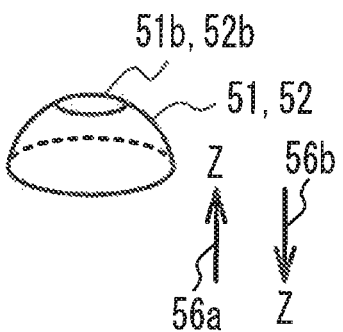
Figure 4L:
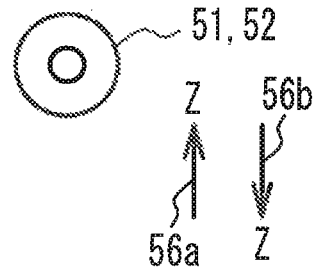
Figure 4M:
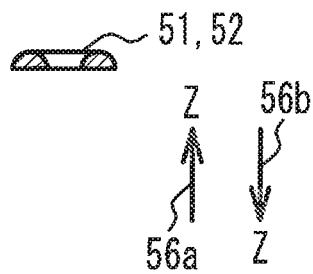

As illustrated in FIG. 4J, the protruding portion 51 and the recessed portion 52 have a hemispheric shape. As illustrated in FIG. 4K, the protruding portion 51 has a shape obtained by removing the upper part of the hemisphere along the upper surface 51b, and the recessed portion 52 has a shape obtained by removing the lower part of the hemisphere along the surface 52b. As described above, the three-dimensional shapes of the protruding portion 51 and the recessed portion 52 may be a part of a sphere shape. The three-dimensional shapes of the protruding portion 51 and the recessed portion 52 may be a part of a prolate spheroid shape or a part of a spheroidal shape. As illustrated in FIG. 4I and FIG. 4M, the protruding portion 51 and the recessed portion 52 have a shape formed of a part of a donut shape. As described above, the three-dimensional shapes of the protruding portion 51 and the recessed portion 52 can be desirably set by appropriately setting the planar shape of the mask layer 44 in FIG. 2B and the etching condition of the support substrate 10 in FIG. 2C.

Figure 5A:
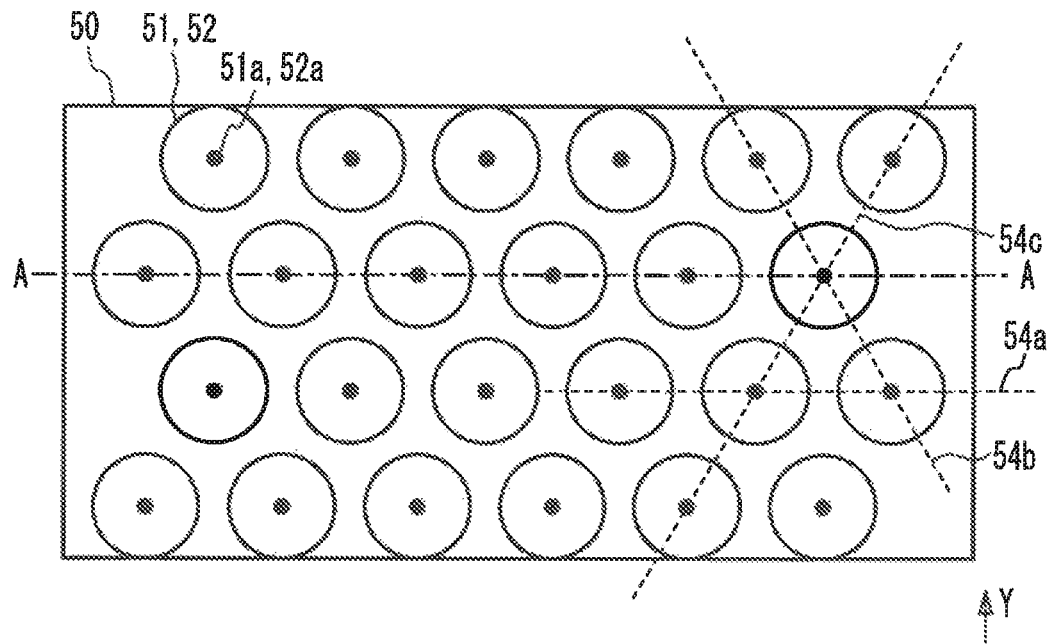
FIG. 5A is a plan view illustrating a first example of the arrangement of the protruding portions and the recessed portions in the first embodiment.
Figure 5B:
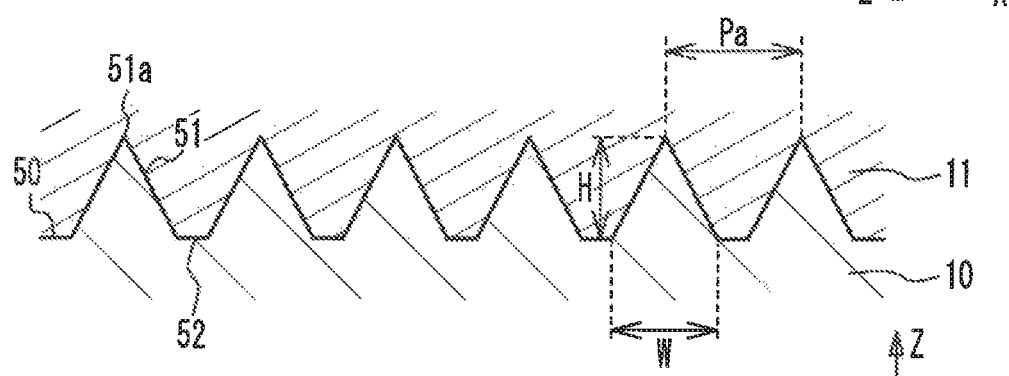
FIG. 5B and FIG. 5C are cross-sectional views taken along line A-A in FIG. 5A.
Figure 5C:
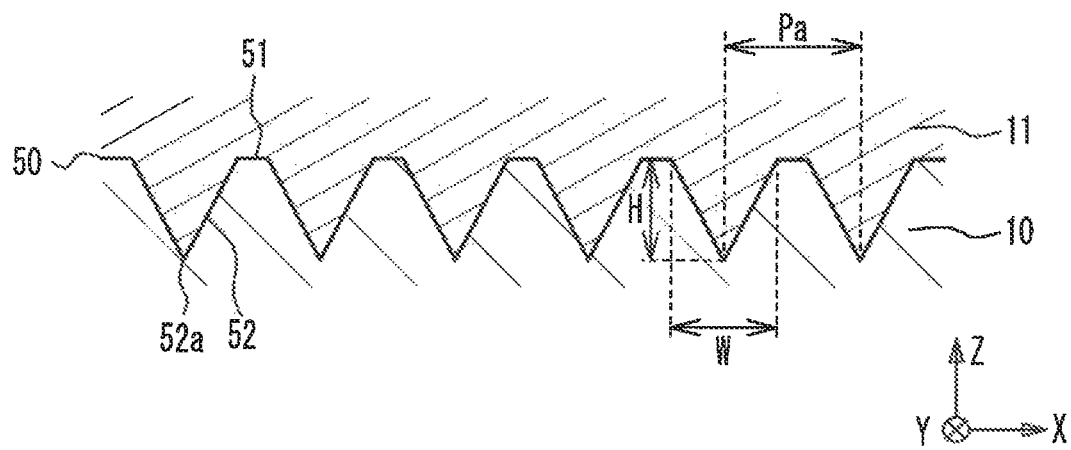

First Example of the Arrangement of the Protruding Portions and the Recessed Portions Examples of the arrangement of the protruding portions 51 and the recessed portions 52 in the XY plane will be described with use of the case where the three-dimensional shapes of the protruding portions 51 and the recessed portions 52 are the shape illustrated in FIG. 4A as an example. FIG. 5A is a plan view illustrating a first example of the arrangement of the protruding portions and the recessed portions in the first embodiment, and FIG. 5B and FIG. 5C are cross-sectional views taken along line A-A in FIG. 5A. FIG. 5B illustrates the protruding portions, and FIG. 5C illustrates the recessed portions.

As illustrated in FIG. 5A to FIG. 5C, the protruding portions 51 and the recessed portions 52 are arranged at constant intervals. The constant intervals between the protruding portions 51 or the constant intervals between the recessed portions 52 are the smallest (the smallest constant interval Pa) in three directions 54a to 54c. The angle between the directions 54a and 54b, the angle between the directions 54b and 54c, and the angle between the directions 54c and 54a are approximately 60°. The direction 54a is substantially parallel to the X direction. In FIG. 5B, the part other than the protruding portions 51 is flat. In FIG. 5C, the part other than the recessed portions 52 is flat. The constant intervals Pa between the protruding portions 51 and the constant intervals Pa between the recessed portions 52 are substantially uniform, the widths W of the protruding portions 51 and the recessed portions 52 in the directions 54a to 54c are substantially uniform, and the heights H of the protruding portions 51 and the recessed portions 52 are substantially uniform. It is noted that the term "substantially uniform" refers to "uniform to the extent that the effect is achieved", and allows the variability to the extent of, for example, manufacturing errors.

Figure 6A:
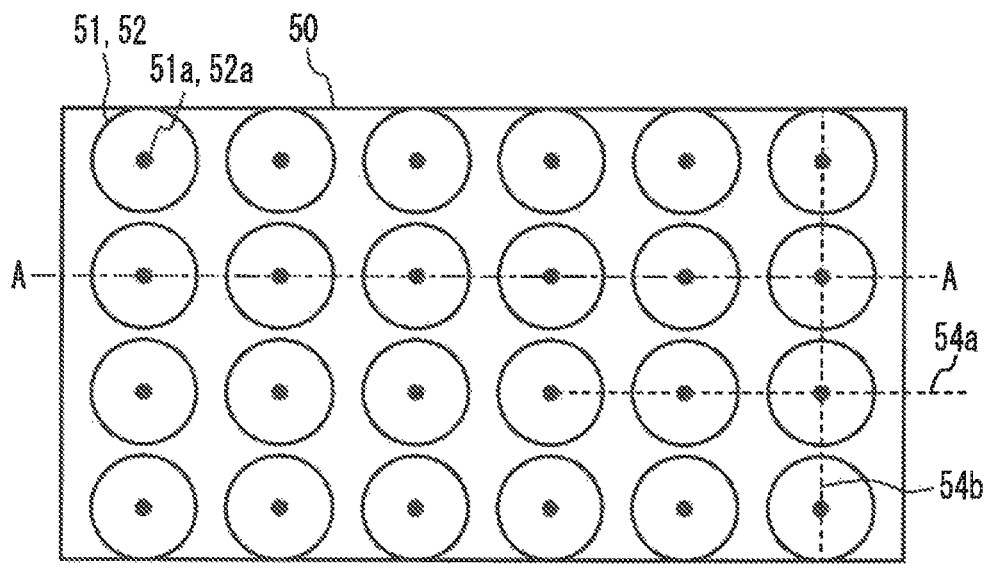
FIG. 6A is a plan view illustrating a second example of the arrangement of the protruding portions and the recessed portions in the first embodiment.
Figure 6B:
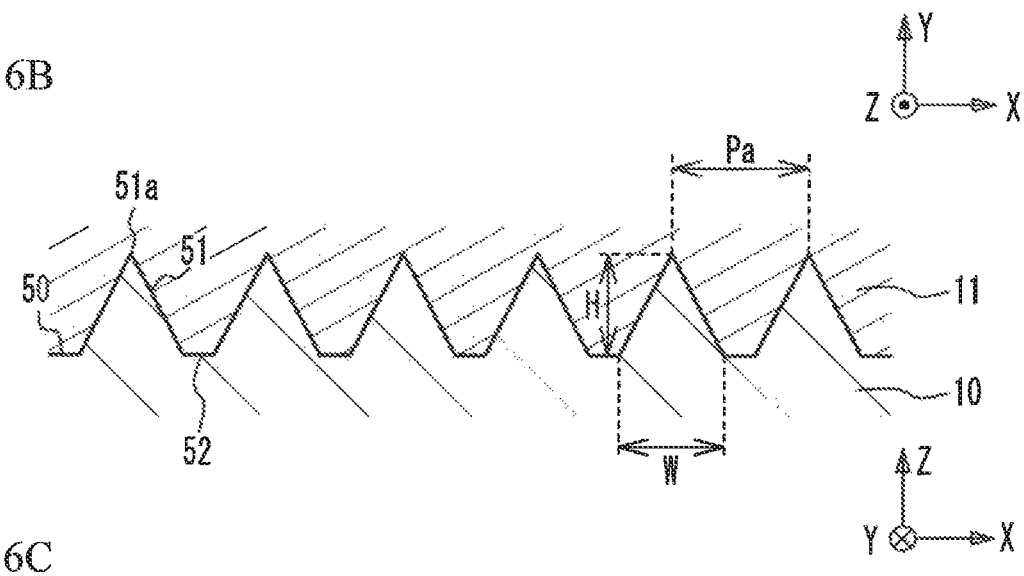
FIG. 6B and FIG. 6C are cross-sectional views taken along line A-A in FIG. 6A.
Figure 6C:
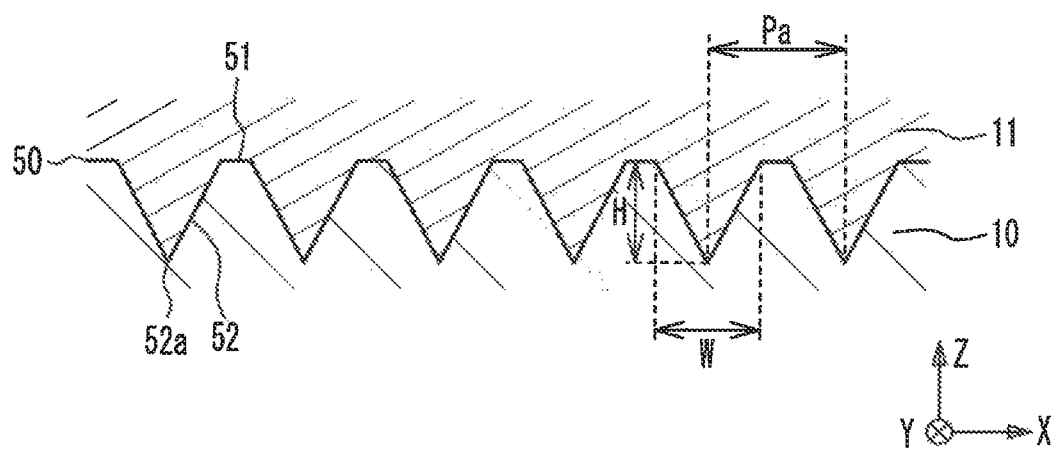

Second Example of the Arrangement of the Protruding Portions and the Recessed Portions FIG. 6A is a plan view illustrating a second example of the arrangement of the protruding portions and the recessed portions in the first embodiment, and FIG. 6B and FIG. 6C are cross-sectional views taken along line A-A in FIG. 6A. As illustrated in FIG. 6A to FIG. 6C, the constant intervals between the protruding portions 51 or the constant intervals between the recessed portions 52 are the smallest (the smallest constant interval Pa) in two directions 54a and 54b. The angle between the directions 54a and 54b is approximately 90°. The direction 54a is substantially parallel to the X direction, and the direction 54b is substantially parallel to the Y direction. In FIG. 6B, the part other than the protruding portions 51 is flat. In FIG. 6C, the part other than the recessed portions 52 is flat. The constant intervals Pa between the protruding portions 51 and the constant intervals Pa between the recessed portions 52 are substantially uniform, the widths W of the protruding portions 51 and the recessed portions 52 in the directions 54a and 54b are substantially uniform, and the heights H of the protruding portions 51 and the recessed portions 52 are substantially uniform.

As in the first and second examples of the arrangement of the protruding portions 51 and the recessed portions 52, one direction 54a of the directions in which the constant interval between the protruding portions 51 or the recessed portions 52 is the constant interval Pa may be substantially parallel to the X direction. As in the second example of the arrangement of the protruding portions 51 and the recessed portions 52, one direction 54b of the directions in which the constant interval between the protruding portions 51 or the recessed portions 52 is the constant interval Pa may be substantially parallel to the extension direction of the electrode fingers 15.

Figure 7A:
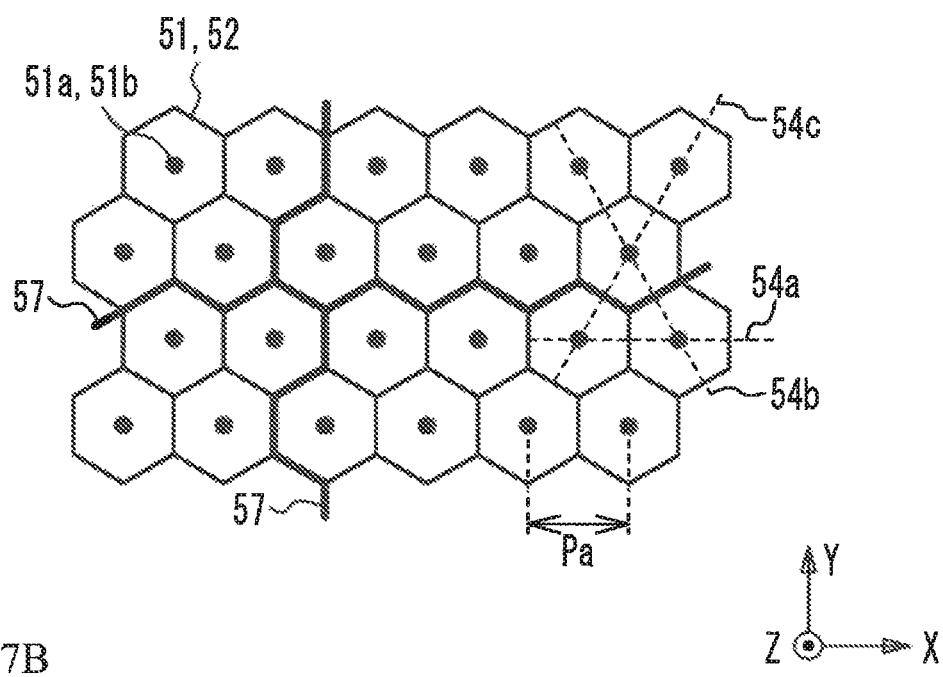
FIG. 7A and FIG. 7B are plan views respectively illustrating third and fourth examples of the arrangement of the protruding portions and the recessed portions in the first embodiment.

Third Example of the Arrangement of the Protruding Portions and the Recessed Portions FIG. 7A is a plan view of a third example of the arrangement of the protruding portions and the recessed portions in the first embodiment. As illustrated in FIG. 7A, when the constant intervals between the protruding portions 51 or the constant intervals between the recessed portions 52 are the smallest in three directions 54a to 54c, the protruding portions 51 or the recessed portions 52 may be in contact with each other. As illustrated in FIG. 7A, as the tops 51a or 52a become closer to each other, the planar shapes of the protruding portions 51 or the recessed portions 52 become a hexagonal shape.

Figure 7B:
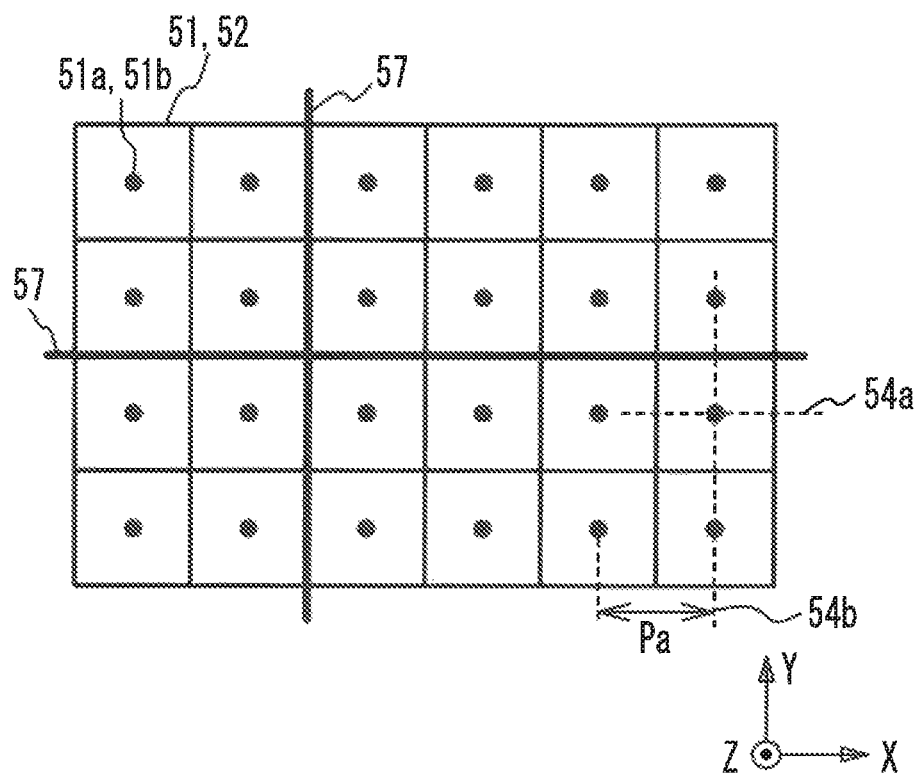

Fourth Example of the Arrangement of the Protruding Portions and the Recessed Portions FIG. 7B is a plan view illustrating a fourth example of the arrangement of the protruding portions and the recessed portions in the first embodiment. As illustrated in FIG. 7B, when the constant intervals between the protruding portions 51 or the constant intervals between the recessed portions 52 are the smallest in two directions 54a and 54b, the protruding portions 51 or the recessed portions 52 may be in contact with each other. As illustrated in FIG. 7B, when the tops 51a or 52a become closer to each other, the planar shapes of the protruding portions 51 or the recessed portions 52 become a quadrangular shape.

Fifth Example of the Arrangement of the Protruding Portions and the Recessed Portions FIG. 8A is a plan view illustrating a fifth example of the arrangement of the protruding portions and the recessed portions in the first embodiment. In FIG. 8A, the electrode fingers 15 are illustrated while superimposed on the protruding portions and the recessed portions. As illustrated in FIG. 8A, the angle between the direction 54a and the X direction is θa and the angle between the direction 54b and the X direction is θb. The angles θa and θb are approximately 45°. The directions 54a and 54b in which the constant intervals between the protruding portions 51 or the recessed portions 52 are the smallest constant interval Pa are not the X direction or the Y direction. Directions 55a and 55b in which the constant intervals between the protruding portions 51 or the recessed portions 52 are the second smallest constant interval Pb are substantially parallel to the X direction and the Y direction.

Sixth Example of the Arrangement of the Protruding Portions and the Recessed Portions FIG. 8B is a plan view illustrating a sixth example of the arrangement of the protruding portions and the recessed portions in the first embodiment. In FIG. 8B, the electrode fingers 15 are illustrated while superimposed on the protruding portions and the recessed portions in the first embodiment. As illustrated in FIG. 8B, the angle θa between the direction 54a and the X direction and the angle θb between the direction 54b and the X direction differ from 45°. The directions 54a and 54b in which the constant interval is the smallest constant interval Pa and the directions 55a and 55b in which the constant interval is the second smallest constant interval Pb are not parallel to the X direction or the Y direction.

As in the first to fourth examples of the arrangement, the directions 54a to 54c in which the constant intervals between the protruding portions 51 and the constant intervals between the recessed portions 52 are the smallest constant interval Pa may be substantially parallel to at least one of the X direction and the Y direction. As in the fifth and sixth examples of the arrangement, the directions 54a and 54b in which the constant interval is the smallest constant interval Pa are not necessarily parallel to the X direction or the Y direction.

In the first to sixth examples of the arrangement, the case where the three-dimensional shapes of the protruding portions 51 and the recessed portions 52 are the shape illustrated in FIG. 4A are described. However, the three-dimensional shapes of the protruding portions 51 and the recessed portions 52 may be any one of the shapes illustrated in FIG. 4B to FIG. 4M, or may be other three-dimensional shapes.

Figure 9A:
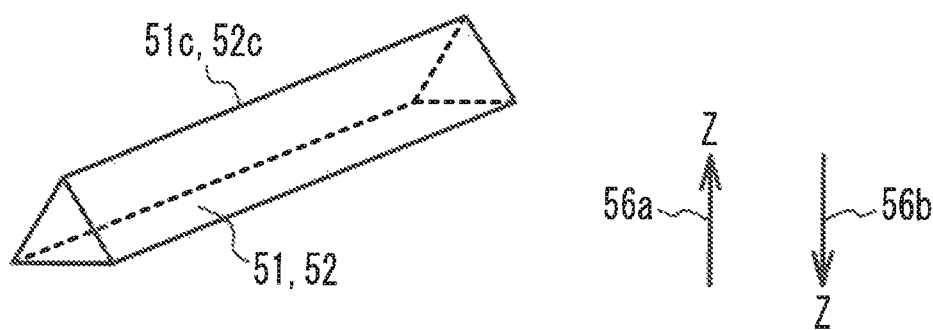
FIG. 9A through FIG. 9C are perspective views illustrating second examples of the three-dimensional shapes of the protruding portion and the recessed portion in the first embodiment.
Figure 9B:
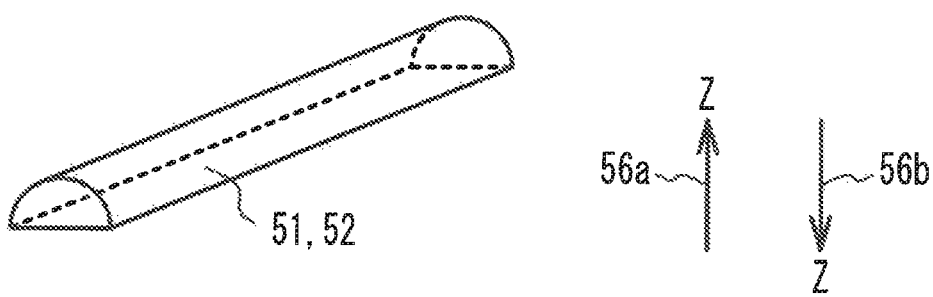
Figure 9C:
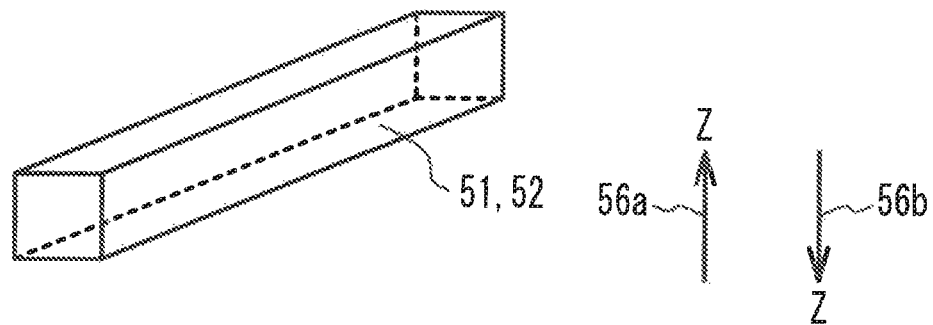

Second Examples of the Three-Dimensional Shapes of the Protruding Portions and the Recessed Portions FIG. 9A to FIG. 9C are perspective views illustrating second examples of three-dimensional shapes of the protruding portions and the recessed portions in the first embodiment. When the protruding portion 51 is illustrated, the upper direction is the positive Z direction as indicated by the arrow 56a. When the recessed portion 52 is illustrated, the upper direction is the negative Z direction as indicated by the arrow 56b. In FIG. 9A to FIG. 9C, the protruding portions 51 and the recessed portions 52 are line-shaped or stripe-shaped.

As illustrated in FIG. 9A, the protruding portion 51 and the recessed portion 52 may have a line shape having a triangular cross section. Lines 51c and 52c are lines connecting the vertices of the triangles in the protruding portion 51 and the recessed portion 52, respectively. As illustrated in FIG. 9B, the protruding portion 51 and the recessed portion 52 may have a line shape having a semicircular cross section. As illustrated in FIG. 9C, the protruding portion 51 and the recessed portion 52 may have a line shape having a quadrangular cross section. As described above, the protruding portion 51 and the recessed portion 52 may linearly extend, or extend in a curved line.

Figure 10A:
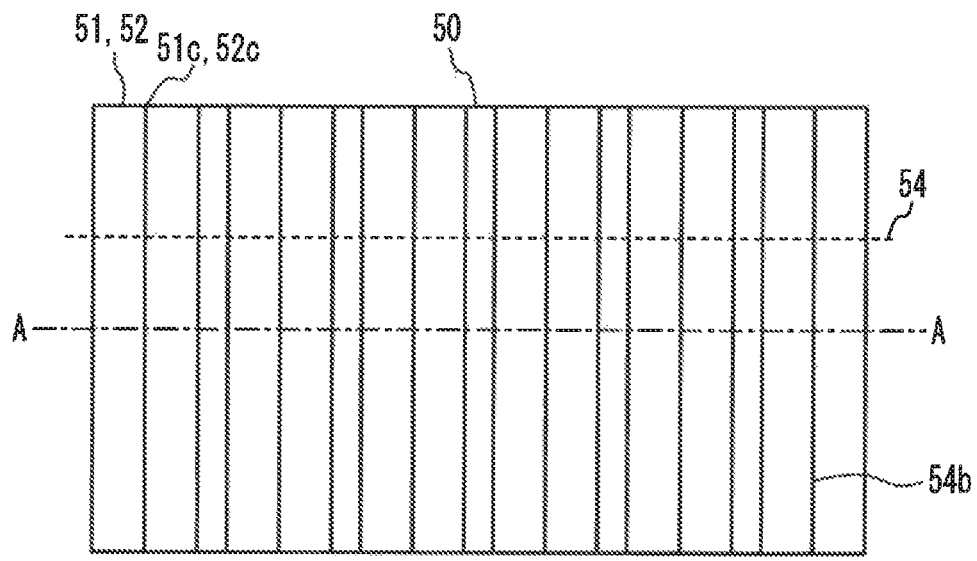
FIG. 10A is a plan view illustrating a seventh example of the arrangement of the protruding portions and the recessed portions in the first embodiment.
Figure 10B:
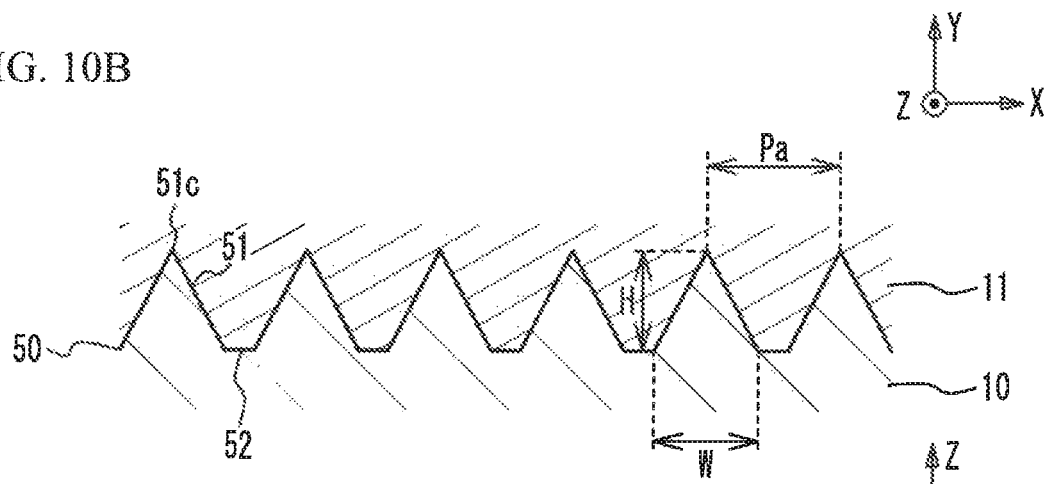
FIG. 10B and FIG. 10C are cross-sectional views taken along line A-A in FIG. 10A.
Figure 10C:
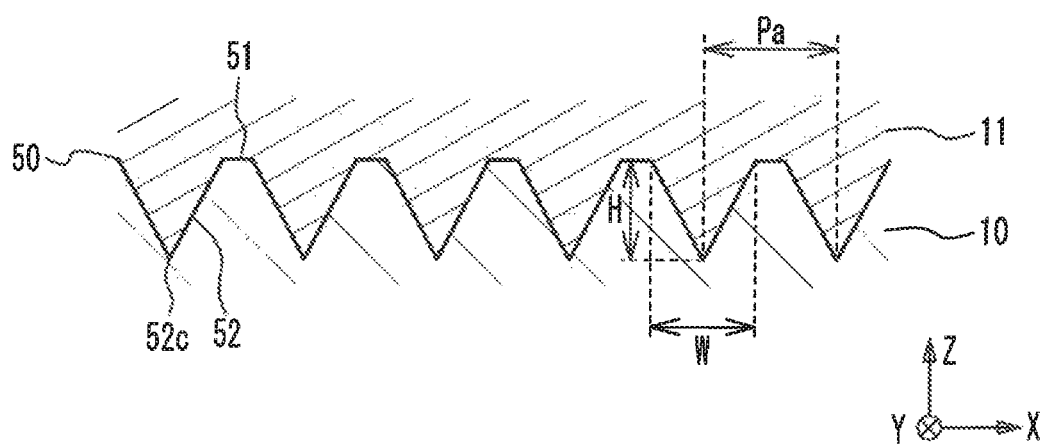

Seventh Example of the Arrangement of the Protruding Portions and the Recessed Portions An example of the arrangement of the protruding portions 51 and the recessed portions 52 in the XY plane will be described for a case where the three-dimensional shapes of the protruding portion 51 and the recessed portion 52 are the shape illustrated in FIG. 9A as an example. FIG. 10A is a plan view illustrating a seventh example of the arrangement of the protruding portions and the recessed portions in the first embodiment, and FIG. 10B and FIG. 10C are cross-sectional views taken along line A-A in FIG. 10A. FIG. 10B illustrates the protruding portions, and FIG. 10C illustrates the recessed portions.

As illustrated in FIG. 10A to FIG. 10C, the protruding portions 51 and the recessed portions 52 are arranged at constant intervals. A direction 54 in which the constant intervals between the protruding portions 51 or the recessed portions 52 are the smallest constant interval Pa is substantially parallel to the X direction. In FIG. 10B, the part other than the protruding portions 51 is flat. In FIG. 10C, the part other than the recessed portions 52 is flat. The constant intervals Pa are substantially uniform, the widths W of the protruding portions 51 and the recessed portions 52 in the direction 54 are substantially uniform, and the heights H of the protruding portions 51 and the recessed portions 52 are substantially uniform.

Figure 11A:
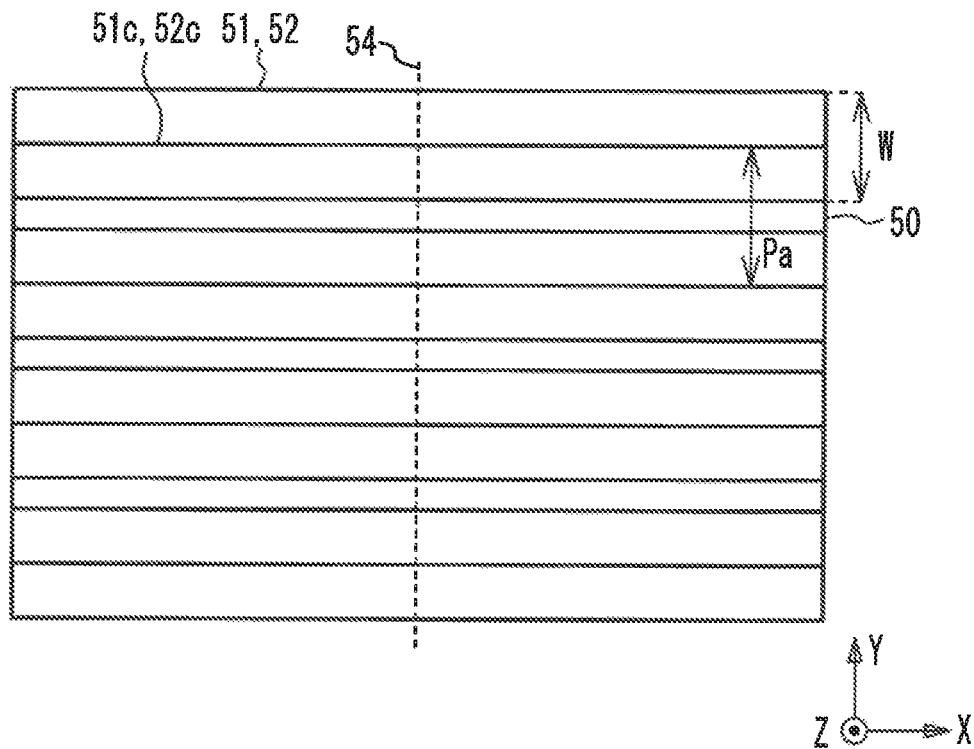
FIG. 11A and FIG. 11B are plan views respectively illustrating eighth and ninth examples of the arrangement of the protruding portions and the recessed portions in the first embodiment.

Eighth and Ninth Examples of the Arrangement of the Protruding Portions and the Recessed Portions FIG. 11A is a plan view illustrating an eighth example of the arrangement of the protruding portions and the recessed portions in the first embodiment. As illustrated in FIG. 11A, the direction 54 in which the constant interval is the smallest constant interval Pa is the Y direction. As in the seventh and eighth examples of the arrangement of the protruding portions and the recessed portions, the direction 54 in which the constant interval is the smallest constant interval Pa may be substantially parallel to the X direction or the Y direction.

Figure 11B:
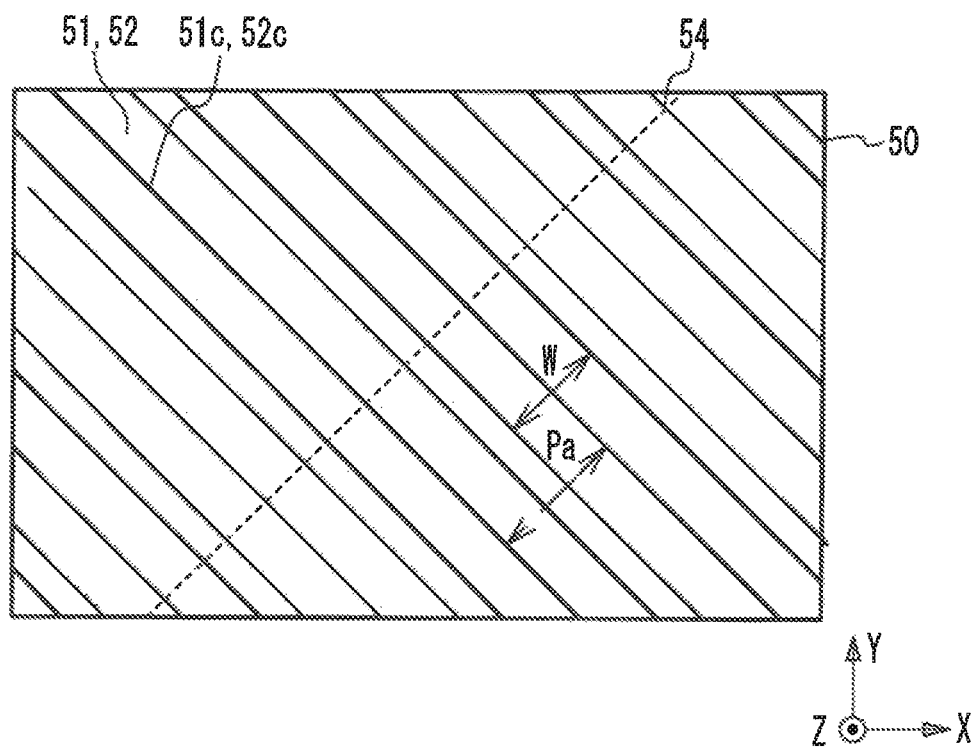

FIG. 11B is a plan view illustrating a ninth example of the arrangement of the protruding portions and the recessed portions in the first embodiment. As illustrated in FIG. 11B, the direction 54 differs from the X direction and the Y direction. That is, the direction 54 is inclined from the X direction and the Y direction. As seen above, the direction 54 is not necessarily parallel to the X direction or the Y direction.

In the seventh to ninth examples of the arrangement, the case where the three-dimensional shapes of the protruding portions 51 and the recessed portions 52 are the shape illustrated in HG. 9A is described, but the three-dimensional shapes of the protruding portions 51 and the recessed portions 52 may be any one of the shapes illustrated in FIG. 9B and FIG. 9C, or may be other three-dimensional shapes. In the seventh to ninth examples of the arrangement, the case where the protruding portions 51 or the recessed portions 52 are located away from each other is described, but the protruding portions 51 or the recessed portions 52 may be in contact with each other.

Figure 12:
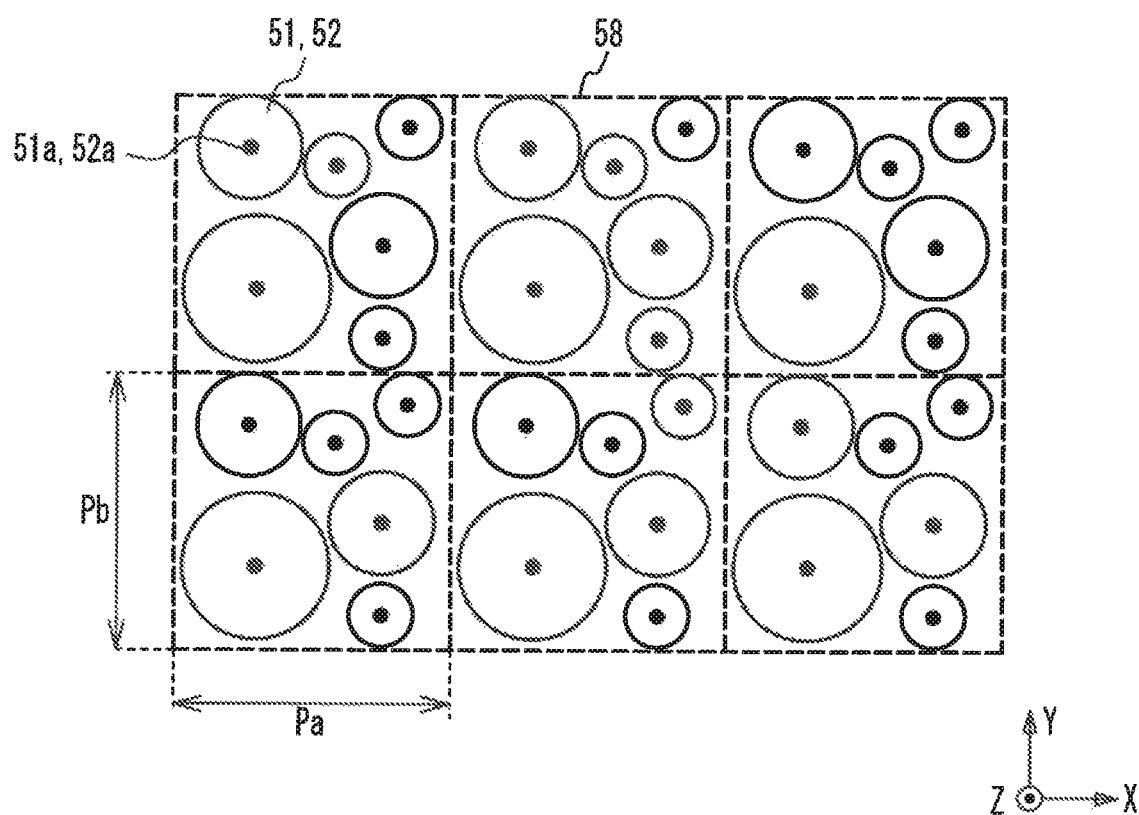
FIG. 12 is a plan view illustrating a tenth example of the arrangement of the protruding portions and the recessed portions in the first embodiment.

Tenth Example of the Arrangement of the Protruding Portions and the Recessed Portions FIG. 12 is a plan view illustrating a tenth example of the arrangement of the protruding portions and the recessed portions in the first embodiment. As illustrated in FIG. 12. In each of areas 58, the protruding portions 51 and the recessed portions 52 are irregularly arranged, and the sizes of the protruding portions 51 and the recessed portions 52 are non-uniform. The areas 58 are periodically arranged in the X direction and the Y direction. The constant intervals Pa and Pb of the areas 58 are substantially uniform. The constant interval Pa is the smallest constant interval among the constant intervals between the protruding portions 51 and the constant intervals between the recessed portions 52, and the constant interval Pb is the second smallest constant interval.

As in the tenth example of the arrangement of the protruding portions and the recessed portions, groups each including a plurality of the protruding portions 51 or a plurality of the recessed portions 52 may be regularly arranged. The case where the three-dimensional shapes of the protruding portions 51 and the recessed portions 52 are the shape illustrated in FIG. 4A has been described, but the three-dimensional shapes of the protruding portions 51 and the recessed portions 52 may be any one of the first and second examples of the three-dimensional shapes, or may be other three-dimensional shapes. The protruding portions 51 having different three-dimensional shapes or the recessed portions 52 having different three-dimensional shapes may be provided within the area 58.

First Variation of the First Embodiment

Figure 13:
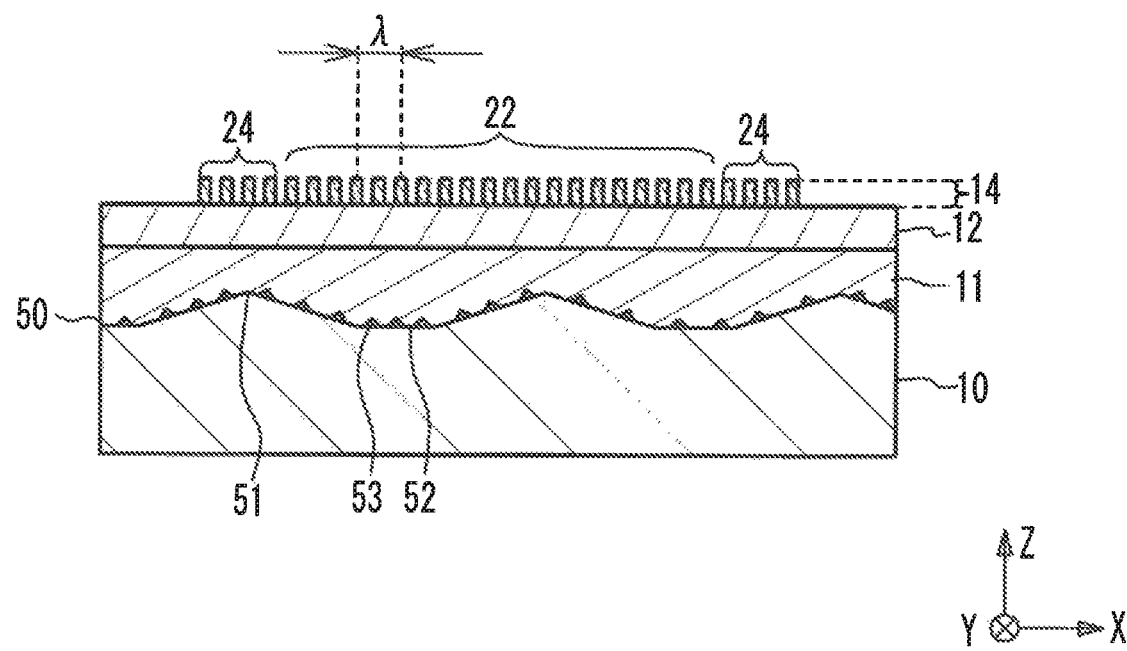
FIG. 13 is a cross-sectional view of an acoustic wave device in accordance with a first variation of the first embodiment.

FIG. 13 is a cross-sectional view of an acoustic wave device in accordance with a first variation of the first embodiment. As illustrated in FIG. 13, an additional film 53 is provided to the boundary face 50 between the support substrate 10 and the insulating layer 11. The roughness of the upper surface of the additional film 53 is less than the roughness of the upper surface of the support substrate 10. The additional film 53 is, for example, an aluminum oxide film, an aluminum nitride film, or a silicon nitride film, and the acoustic impedance of the additional film 53 is greater than the acoustic impedance of the insulating layer 11. The thickness of the additional film 53 is, for example, 0.1 μm or less. This configuration causes the acoustic wave to be more scattered on the boundary face 50. The additional film 53 may be provided in an island pattern, or may have a structure in which the additional film 53 is formed of a single-layer film having parts with different thicknesses. Other structures are the same as those of the first embodiment, and the description thereof is thus omitted. As in the first variation of the first embodiment, the insulating layer 11 may be indirectly bonded to the support substrate 10.

Simulation 1

The first embodiment and the first comparative example were simulated. For the first comparative example, it was assumed that the boundary face 50 between the support substrate 10 and the insulating layer 11 was flat. The simulation conditions are as follows.

Support substrate 10: Sapphire substrate

Insulating layer 11: Silicon oxide film with an average thickness of 2 μm (0.4λ)

Piezoelectric substrate 12: 42° rotated Y-cut X-propagation lithium tantalate substrate with a thickness of 2 μm (0.4λ)

Electrode finger 15: Aluminum film with a thickness of 500 nm

Pitch λ of the electrode fingers 15: 5 μm

Number of pairs of the electrode fingers 15: 10 pairs

Protruding portion 51: having a cross-sectional shape illustrated in the cross-sectional view of FIG. 5B where Pa=3 μm, W=2.7 μm, and H=1.65 μm The admittance was simulated with use of the 2.5 dimensional finite element method under the assumption that the width in the Y direction was λ/32. The simulation result of the admittance were converted to the admittance of the acoustic wave resonator in which the number of pairs of the electrode fingers 15 is 100 pairs and the aperture length is 25λ.

Figure 14:
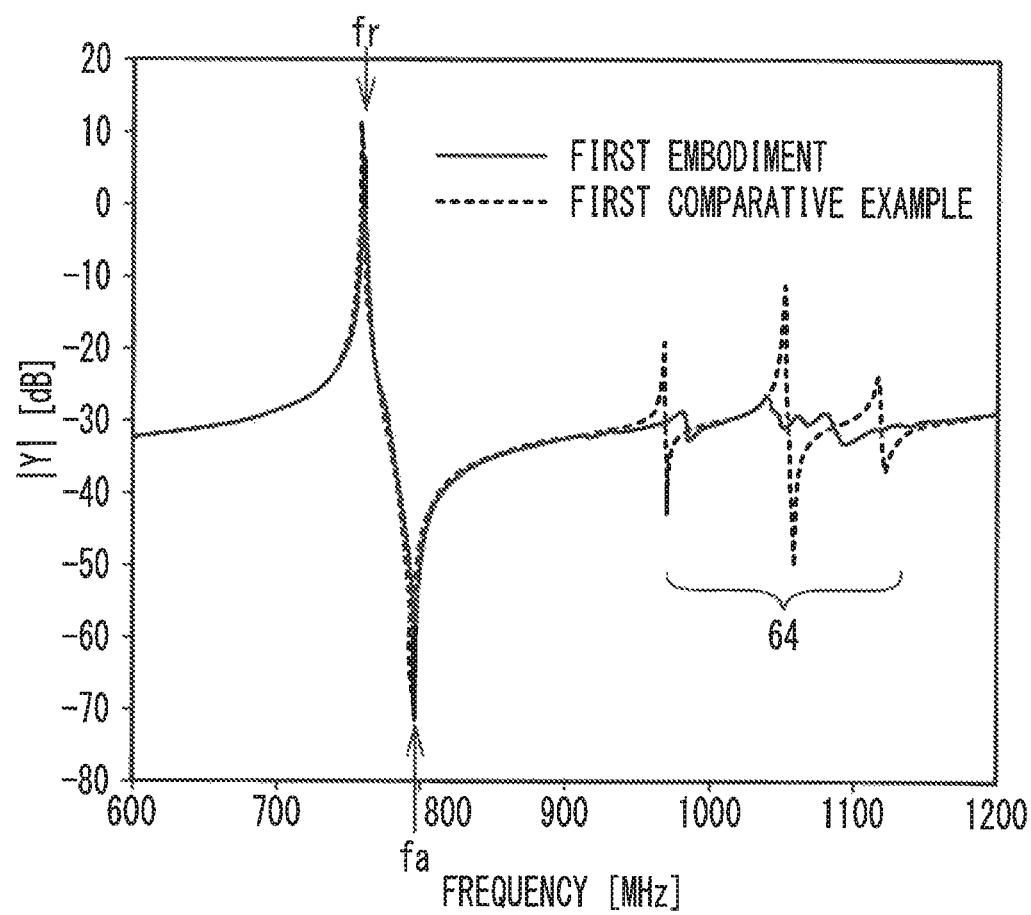
FIG. 14 is a graph of the magnitude of admittance versus frequency in a simulation 1.

FIG. 14 is a graph of the magnitude of the admittance versus frequency in the simulation 1. As illustrated in FIG. 14, spurious emissions 64 are generated at frequencies higher than the resonant frequency fr and the antiresonant frequency fa. The spurious emissions 64 are due to bulk waves excited together with the acoustic wave in the primary mode excited by the electrode fingers 15. When the support substrate 10 is a hard substrate, the acoustic velocity in the support substrate 10 is faster than the acoustic velocities in the insulating layer 11 and the piezoelectric substrate 12. That is, the acoustic impedance of the support substrate 10 is higher than the acoustic impedance of the insulating layer 11 and the acoustic impedance of the piezoelectric substrate 12. When the boundary face 50 between the support substrate 10 and the insulating layer 11 is flat as in the first comparative example, the bulk wave excited by the electrode fingers 15 is reflected by the boundary face 50. The spurious emission 64 is generated due to the reflected bulk wave. In the first embodiment, since the boundary face 50 is rough, the bulk wave is scattered by the boundary face or is absorbed in the support substrate 10. Therefore, the spurious emissions 64 are smaller than those in the first comparative example. As described above, the first embodiment can reduce spurious emissions.

Simulation 2

A simulation was performed under the assumption that the boundary face 50 between the support substrate 10 and the insulating layer 11 was an irregularly rough surface. The difference D between the maximum value and the minimum value in the Z direction of the boundary face 50 were varied as follows.

Sample A: D=1 μm
Sample B: D=2 μm
Sample C: D=4 μm

Other simulation conditions are the same as those of the simulation 1.

Figure 15:
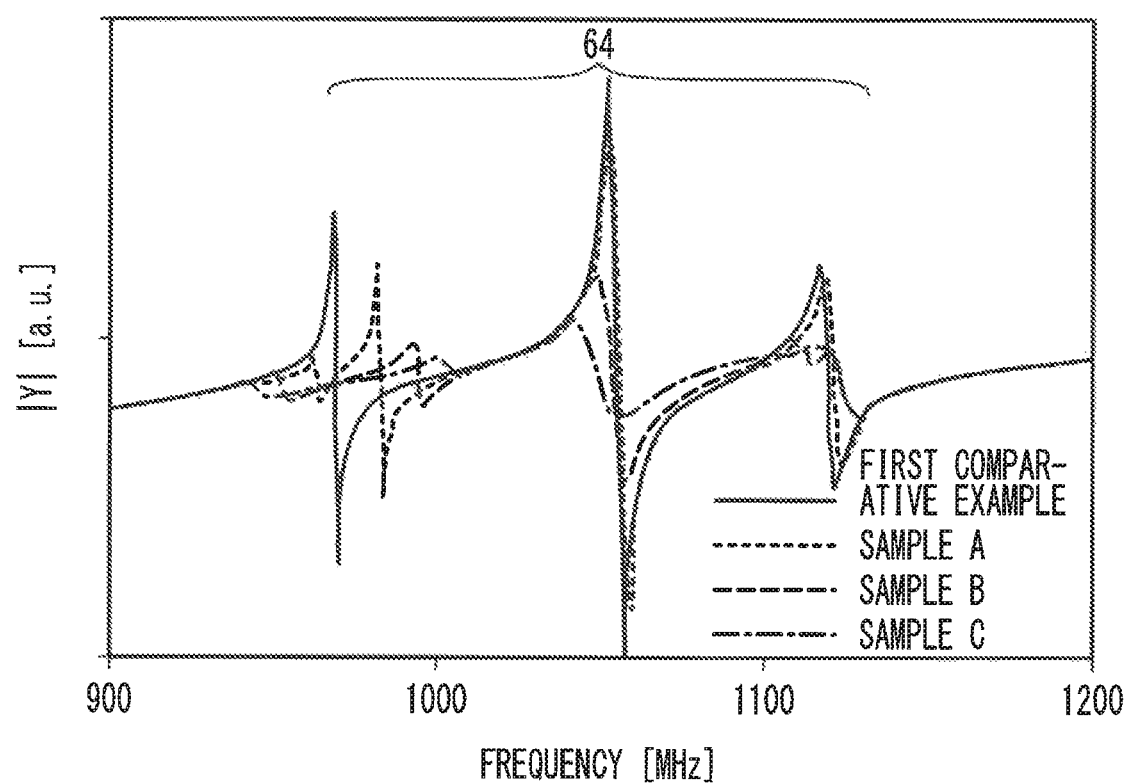
FIG. 15 is a graph of the magnitude of admittance versus frequency in a simulation 2.

FIG. 15 is a graph of the magnitude of admittance versus frequency in the simulation 2. The frequency band in which the spurious emissions 64 due to the bulk waves are formed is enlarged. As illustrated in FIG. 15, the magnitude of the spurious emission of the sample A is substantially the same as that of the first comparative example. The spurious emissions of the sample B are smaller than those of the sample A, and the spurious emissions of the sample C are smaller than those of the sample B. As described above, the magnitude of the spurious emission changes depending on the roughness of the rough surface.

The roughness of the rough surface having irregular unevenness differs depending on the location in the XY plane. Thus, in the microscopic sense, the characteristics such as the magnitude of the spurious emission differs depending on the location. For example, even when the roughness of the rough surface is made to be the roughness with which the spurious emission becomes the smallest, since the magnitude of the spurious emission differs depending on the location, the magnitude of the spurious emission becomes greater than the optimal spurious emission macroscopically.

In the first embodiment, the protruding portions 51 and/or the recessed portions 52 are regularly arranged. This structure makes the characteristics such as the magnitude of the spurious emission uniform Experiment 1

The acoustic wave resonators of the first embodiment and the first comparative example were fabricated. The fabrication conditions are as follows.

Support substrate 10: Sapphire substrate with a thickness of 500 μm

Insulating layer 11: Silicon oxide film with an average thickness of 2.8 μm (0.4λ)

Bonding layer 13: Aluminum oxide film with a thickness of 10 nm

Piezoelectric substrate 12: 42° rotated Y-cut X-propagation lithium tantalate substrate with a thickness of 2 μm (0.4λ)

Figure 16:
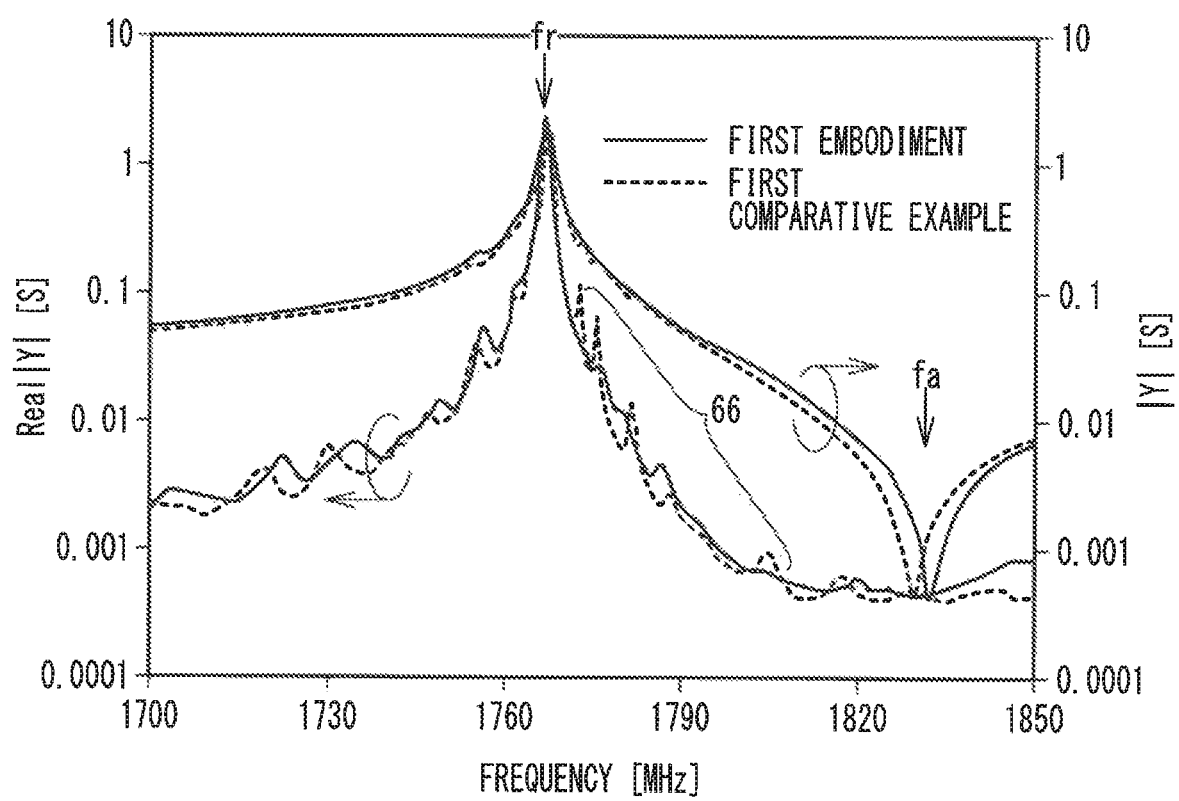
FIG. 16 is a graph of the real part and the magnitude of admittance versus frequency in an experiment 1.

Electrode finger 15: Titanium film with a thickness of 160 nm and an aluminum film with a film thickness of 268 nm stacked in this order from the piezoelectric substrate 12 side Pitch λ of the electrode fingers 15: 5 μm Number of pairs of the electrode fingers 15: 100 pairs Three-dimensional shape of the protruding portion 51: Cone shape illustrated in FIG. 4A Arrangement of the protruding portions 51: Arrangement illustrated in FIG. 8B where Pa=3 μm. W=2.7 μm, and H=1.65 μm FIG. 16 is a graph of the real part and the magnitude of admittance versus frequency in the experiment 1. FIG. 16 is an enlarged view around the resonant frequency fr and the antiresonant frequency fa. As illustrated in FIG. 16, spurious emissions 66 in the first embodiment are smaller than those in the first comparative example. The spurious emissions 66 are not due to bulk wave, and are lateral-mode spurious emissions due to the acoustic wave propagating in the Y direction. As illustrated in FIG. 16, in the first embodiment, lateral-mode spurious emissions are reduced. In particular, lateral-mode spurious emissions are reduced by making the directions 54a and 54b different from both the X direction and the Y direction as illustrated in FIG. 8B.

In the first embodiment, a pair of the comb-shaped electrodes 18 is located on the piezoelectric substrate 12, and includes a plurality of the electrode fingers 15. The support substrate 10 has the protruding portions 51 and/or the recessed portions 52 regularly arranged. The insulating layer 11 is directly or indirectly bonded between the piezoelectric substrate 12 and the support substrate 10, and the boundary face between the insulating layer 11 and the support substrate 10 is provided along the protruding portions 51 and/or the recessed portions 52. This structure improves the uniformity of the characteristics such as the magnitude of the spurious emission.

The insulating layer 11 is in contact with the upper surface of the support substrate 10. This structure causes a bulk wave to be scattered on the boundary face 50 or absorbed in the support substrate 10, thereby reducing the spurious emissions 64.

The arithmetic mean roughness Ra of the boundary face 50 is preferably 10 nm or greater and 1000 nm or less, more preferably 50 nm or greater and 500 nm or less, further preferably 100 nm or greater and 300 nm or less. The arithmetic mean roughness of the boundary face 50 is preferably equal to or greater than 10 times, more preferably equal to or greater than 100 times the arithmetic mean roughness of the boundary face between the insulating layer 11 and the piezoelectric substrate 12 and/or the arithmetic mean roughness of the surface of the piezoelectric substrate 12.

As in the fifth, sixth, and ninth examples of the arrangement of the protruding portions and the recessed portions, the directions 54, 54a, and 54b in which the constant intervals between the protruding portions 51 and/or the recessed portions 52 are the smallest constant interval Pa are the directions different from the arrangement direction of the electrode fingers 15 (the X direction). This structure makes the phases of the bulk waves propagating in the X direction and being reflected by the recessed portions 52 or the protruding portions 51 different. Thus, spurious emissions due to bulk waves are reduced. The angle between each of the directions 54, 54a, and 54b and the X direction is preferably 10° or greater, more preferably 20° or greater, further preferably 30° or greater.

The directions 54, 54a, and 54b in which the constant interval is the smallest constant interval Pa are the directions different from the extension direction (the Y direction) of the electrode fingers 15. This structure causes the phases of the acoustic waves propagating in the Y direction and being reflected by the recessed portions 52 or the protruding portions 51 different. Thus, lateral-mode spurious emissions are reduced. The angle between each of the directions 54, 54a, and 54b and the Y direction is preferably 10° or greater, more preferably 20° or greater, further preferably 30° or greater.

As in the sixth example of the arrangement of the protruding portions and the recessed portions, the directions 54a and 54b in which the constant intervals between the protruding portions 51 and/or the recessed portions 52 are the smallest constant interval Pa and the directions 55a and 55b in which the constant intervals between the protruding portions 51 and/or the recessed portions 52 are the second smallest constant interval Pb are the directions different from both the X direction and the Y direction. This structure further reduces spurious emissions due to bulk waves and lateral-mode spurious emissions. The angle between each of the directions 55a and 55b and the X direction and the angle between each of the directions 55a and 55b and the Y direction are preferably 10° or greater, more preferably 20° or greater, further preferably 30° or greater.

The constant interval Pa is preferably equal to or greater than $\lambda/16$ and less than $\lambda$ when the wavelength of the acoustic wave is represented by $\lambda$. That is, the smallest constant interval Pa is preferably equal to or greater than ⅛ times the pitch of the electrode fingers 15 and less than two times the pitch of the electrode fingers 15. This configuration can cause the phases of the bulk waves propagating in the X direction and/or the phases of the acoustic waves propagating in the Y direction to be different. Thus, spurious emissions are further reduced. The constant interval Pa is more preferably equal to or greater than 0.15 times the pitch of the electrode fingers 15 and equal to or less than 1.8 times the pitch of the electrode fingers 15, further preferably equal to or greater than ¼ times the pitch of the electrode fingers 15 and equal to or less than ¾ times the pitch of the electrode fingers 15. The average pitch of the electrode fingers 15 is calculated by dividing the length in the X direction of the IDT 22 by the number of the electrode fingers 15.

As illustrated in FIG. 4A to FIG. 4I illustrating the first examples of the three-dimensional shape, the protruding portions 51, the recessed portions 52, or the protruding portions 51 and the recessed portion 52 are island-shaped. As illustrated in FIG. 9A to FIG. 9C illustrating the second examples of the three-dimensional shape, the protruding portions 51, the recessed portions 52, or the protruding portions 51 and the recessed portion 52 may have a shape extending in one direction of planar directions.

In FIG. 7A illustrating the third example of the arrangement of the protruding portions and the recessed portions, the direction 54a in which the constant interval is the smallest constant interval Pa is the X direction, but the directions 54b and 54c are not parallel to the Y direction. The X direction and the Y direction are along the side surfaces of the support substrate 10. In this case, as indicated by a bold line 57, the support substrate 10 is likely to be split unevenly. Thus, a crack starting from the protrusion portion or the recessed portion may be introduced into the support substrate 10.

On the other hand, in FIG. 7B illustrating the fourth example of the arrangement of the protruding portions and the recessed portions, the directions 54a and 54b in which the constant interval is the smallest constant interval Pa are substantially parallel to the X direction and the Y direction, respectively. When the support substrate 10 is cut, the support substrate 10 is linearly split as indicated by the bold line 57. Thus, cracks are inhibited from being formed in the support substrate 10.

When the IDT 22 excites a shear horizontal (SH) wave, a bulk wave tends to be generated. When the piezoelectric substrate 12 is a 36° or greater and 48° or less rotated Y-cut lithium tantalate substrate, the SH wave is excited. Thus, in this case, it is preferable to provide the protruding portions 51 and the recessed portions 52 of the boundary face 50. When the thickness of the piezoelectric substrate 12 is equal to or less than the wavelength $\lambda$ of the acoustic wave, i.e., when the thickness of the piezoelectric substrate 12 is equal to or less than two times the average value of the pitches of the electrode fingers 15, loss is reduced. When the distance from the upper surface of the support substrate 10 to the upper surface of the piezoelectric substrate 12 is equal to or less than four times the average value of the pitches of the electrode fingers 15, loss is reduced.

To prevent leak of the acoustic wave to the support substrate 10, it is preferable that the acoustic impedance of the support substrate 10 is higher than the acoustic impedance of the piezoelectric substrate 12 (i.e., the acoustic velocity in the support substrate 10 is faster than the acoustic velocity in the piezoelectric substrate 12). Since the acoustic wave propagates in the insulating layer 11, it is preferable that the acoustic impedance of the insulating layer 11 is less than the acoustic impedance of the piezoelectric substrate 12 and the support substrate 10 (i.e., the acoustic velocity in the insulating layer 11 is less than the acoustic velocities in the piezoelectric substrate 12 and the support substrate 10).

Second Embodiment

Figure 17A:
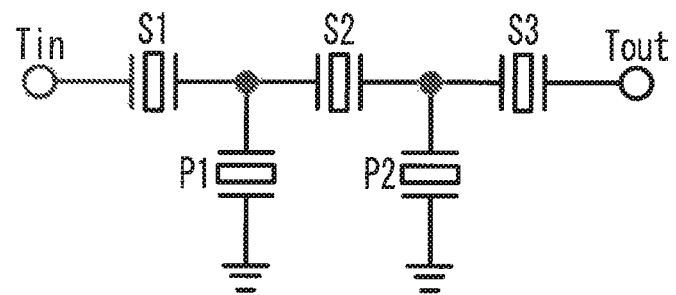
FIG. 17A is a circuit diagram of a filter in accordance with a second embodiment.

FIG. 17A is a circuit diagram of a filter in accordance with a second embodiment. As illustrated in FIG. 17A, one or more series resonators S1 to S3 are connected in series between an input terminal Tin and an output terminal Tout. One or more parallel resonators P1 and P2 are connected in parallel between the input terminal Tin and the output terminal Tout. The acoustic wave resonator of the first embodiment can be used for at least one of the one or more series resonators S1 to S3 and the one or more parallel resonators P1 and P2. The number of resonators in the ladder-type filter can be freely selected. The filter may be a multimode type filter.

First Variation of the Second Embodiment

Figure 17B:
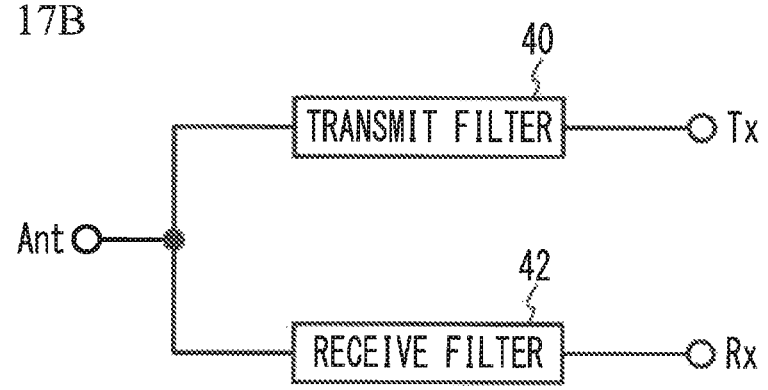
FIG. 17B is a circuit diagram of a duplexer in accordance with a first variation of the second embodiment.

FIG. 17B is a circuit diagram of a duplexer in accordance with a first variation of the second embodiment. As illustrated in FIG. 17B, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among high-frequency signals input from the transmit terminal Tx, and suppresses signals with other frequencies. The receive filter 42 transmits signals in the receive band to the receive terminal Rx as reception signals among high-frequency signals input from the common terminal Ant, and suppresses signals with other frequencies. At least one of the transmit filter 40 and the receive filter 42 may be the filter of the second embodiment.

A duplexer has been described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:
1. An acoustic wave device comprising:
a piezoelectric substrate:
a pair of comb-shaped electrodes located on the piezoelectric substrate, each of the comb-shaped electrodes including a plurality of electrode fingers;
a support substrate having protruding portions and/or recessed portions in a region overlapping with the pair of comb-shaped electrodes in plan view, the protruding portions and/or recessed portions being regularly arranged at constant intervals, each of the constant intervals between the protruding portions and/or between the recessed portions being substantially uniform; and an insulating layer directly or indirectly bonded between the piezoelectric substrate and the support substrate, a boundary face between the insulating layer and the support substrate being provided along the protruding portions and/or the recessed portions.

2. The acoustic wave device according to claim 1, wherein a direction in which a constant interval between the protruding portions and/or a constant interval between the recessed portions is a smallest constant interval is a direction different from an arrangement direction of the electrode fingers.

3. The acoustic wave device according to claim 2, wherein the smallest constant interval among the constant interval between the protruding portions and/or the constant interval between the recessed portions is equal to or greater than ¼ times a pitch of the electrode fingers and less than 2 times the pitch of the electrode fingers.

4. The acoustic wave device according to claim 1, wherein a direction in which a constant interval between the protruding portions and/or a constant interval between the recessed portions is a smallest constant interval is a direction different from an extension direction of the electrode fingers.

5. The acoustic wave device according to claim 1, wherein a direction in which a constant interval between the protruding portions and/or a constant interval between the recessed portions is a smallest constant interval and a direction in which the constant interval between the protruding portions and/or the constant interval between the recessed portions is a second smallest constant interval are directions different from both an arrangement direction of the electrode fingers and an extension direction of the electrode fingers and are not parallel.

6. The acoustic wave device according to claim 1, wherein the protruding portions, the recessed portions, or the protruding portions and the recessed portions are island-shaped.

7. The acoustic wave device according to claim 1, wherein the protruding portions, the recessed portions, or the protruding portions and the recessed portions extend in one direction of planar directions.

8. The acoustic wave device according to claim 7, wherein both of directions in which a constant interval between the protruding portions and/or a constant interval between the recessed portions is a smallest constant interval are substantially parallel to respective side surfaces of the support substrate.

9. The acoustic wave device according to claim 1, wherein a plurality of directions in which the constant interval is a smallest constant interval are not parallel, and the protruding portions and/or recessed portions are separated from each other.

10. The acoustic wave device according to claim 9, wherein
at least one of the plurality of directions is a direction different from both of an arrangement direction of the electrode fingers and an extension direction of the electrode fingers.

11. The acoustic wave device according to claim 10, wherein
another direction among the plurality of directions is the arrangement direction or the extension direction.

12. The acoustic wave device according to claim 9, wherein
each of the plurality of directions is a direction different from both of an arrangement direction of the electrode fingers and an extension direction of the electrode fingers.

13. The acoustic wave device according to claim 9, wherein
at least one of the plurality of directions is an arrangement direction of the electrode fingers or an extension direction of the electrode fingers.

14. A filter comprising:
an acoustic wave device including:
a piezoelectric substrate,
a pair of comb-shaped electrodes located on the piezoelectric substrate, each of the comb-shaped electrodes including a plurality of electrode fingers,
a support substrate having protruding portions and/or recessed portions in a region overlapping with the pair of comb-shaped electrodes in plan view, the protruding portions and/or recessed portions being regularly arranged at constant intervals, each of the constant intervals between the protruding portions and/or between the recessed portions being substantially uniform, and
an insulating layer directly or indirectly bonded between the piezoelectric substrate and the support substrate, a boundary face between the insulating layer and the support substrate being provided along the protruding portions and/or the recessed portions.

15. A multiplexer comprising:
a filter including an acoustic wave device, wherein
the acoustic wave device includes:
a piezoelectric substrate,
a pair of comb-shaped electrodes located on the piezoelectric substrate, each of the comb-shaped electrodes including a plurality of electrode fingers,
a support substrate having protruding portions and/or recessed portions in a region overlapping with the pair of comb-shaped electrodes in plan view, the protruding portions and/or recessed portions being regularly arranged at constant intervals, the constant intervals between the protruding portions and/or recessed portions being substantially uniform, and
an insulating layer directly or indirectly bonded between the piezoelectric substrate and the support substrate, a boundary face between the insulating layer and the support substrate being provided along the protruding portions and/or the recessed portions.

* * * * *